United States Patent
Xu

(10) Patent No.: US 10,910,478 B1
(45) Date of Patent: Feb. 2, 2021

(54) METAL-OXIDE-SEMICONDUCTOR FIELD-EFFECT TRANSISTOR HAVING ENHANCED HIGH-FREQUENCY PERFORMANCE

(71) Applicant: Shuming Xu, Sunnyvale, CA (US)

(72) Inventor: Shuming Xu, Sunnyvale, CA (US)

( * ) Notice: Subject to any disclaimer, the term of this patent is extended or adjusted under 35 U.S.C. 154(b) by 0 days.

(21) Appl. No.: 16/808,703

(22) Filed: Mar. 4, 2020

(51) Int. Cl.
*H01L 29/423* (2006.01)
*H01L 29/36* (2006.01)
*H01L 29/78* (2006.01)
*H01L 29/66* (2006.01)

(52) U.S. Cl.
CPC .......... *H01L 29/4236* (2013.01); *H01L 29/36* (2013.01); *H01L 29/42364* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,413,822 B2 | 7/2002 | Williams et al. | |
| 7,485,924 B2 | 2/2009 | Takimoto et al. | |
| 7,535,057 B2 | 5/2009 | Yang | |
| 7,719,054 B2 | 5/2010 | Williams et al. | |
| 8,502,312 B2 | 8/2013 | Hebert | |
| 9,059,281 B2 | 6/2015 | Brochu, Jr. et al. | |
| 9,070,765 B2 | 6/2015 | Finney et al. | |
| 9,178,054 B2 | 11/2015 | Zinn | |
| 9,184,278 B2 | 11/2015 | Zinn | |
| 9,299,788 B2 | 3/2016 | Sun | |
| 9,425,303 B1 | 8/2016 | Titus | |
| 9,570,545 B2 | 2/2017 | Dong et al. | |
| 10,008,598 B2 | 6/2018 | Mallikarjunaswamy et al. | |
| 10,020,369 B2 | 7/2018 | Mallikarjunaswamy | |
| 2004/0251503 A1* | 12/2004 | Hayashi | H01L 29/7806 257/368 |
| 2007/0045727 A1 | 3/2007 | Shiraishi et al. | |
| 2019/0229214 A1 | 7/2019 | Chen et al. | |

OTHER PUBLICATIONS

Jie et al., "Dual-Gate Lateral Double-Diffused Metal-Oxide Semiconductor with Ultra-Low Specific On-Resistance", Chinese Physical Society and IOP Publishing Ltd., vol. 22, No. 4, pp. 1-6; 2013.
Xiao-Rong et al., "A Low On-Resistance Triple RESURF SOI LDMOS with Planar and Trench Gate Integration", Chinese Physical Society and IOP Publishing Ltd., vol. 21, No. 6, pp. 1-5; 2012.

* cited by examiner

*Primary Examiner* — Thien F Tran
(74) *Attorney, Agent, or Firm* — Hoffmann & Baron, LLP

(57) ABSTRACT

A MOSFET device includes an epitaxial region disposed on an upper surface of a substrate, and at least two body regions formed in the epitaxial region. The body regions are disposed proximate an upper surface of the epitaxial region and spaced laterally apart. The device further includes at least two source regions disposed in respective body regions, proximate an upper surface of the body regions, and a gate structure including at least two planar gates and a trench gate. Each of the planar gates is disposed on the upper surface of the epitaxial region and overlaps at least a portion of a corresponding body region. The trench gate is formed partially through the epitaxial region and between the body regions. A drain contact disposed on a back surface of the substrate provides electrical connection with the substrate.

23 Claims, 23 Drawing Sheets

METAL-OXIDE-SEMICONDUCTOR FIELD-EFFECT TRANSISTOR HAVING ENHANCED HIGH-FREQUENCY PERFORMANCE

BACKGROUND

The present invention relates generally to the electrical, electronic and computer arts, and, more particularly, to power transistor devices and fabrication methods.

Power transistors, such as power metal-oxide-semiconductor field-effect transistors (MOSFETs), are generally designed to be able to sustain high on-sate source-to-drain current density and high off-state blocking voltage between drain and source. There are numerous transistor device types, such as lateral and vertical devices, planar gate and trench gate, unipolar and bipolar transistors, each designed for a specific application. Many of the design parameters are mutually exclusive, such that an improvement in one parameter results in a degradation of another parameter. Therefore, among the different transistor designs there exists a particular performance trade-off.

Design and performance criteria for a transistor can be measured using several attributes, including drain-to-source breakdown voltage ($BV_{ds}$), specific on-state resistance ($R_{sp}$), gate capacitance ($C_g$) and gate-to-drain capacitance ($C_{gd}$). These performance attributes are highly dependent on the transistor design, structure and selection of materials, among other factors. Furthermore, these transistor performance attributes typically follow an opposite trend with respect to key design parameters such as gate length, channel and drift region dopant concentration, drift region length, total gate width, and so on, thus making the transistor device design challenging. For example, increasing the drift region dopant concentration in a transistor would reduce the specific on-resistance but at the same time would decrease the breakdown voltage, which may render the transistor device unsuitable to meet a breakdown voltage rating for its particular application. Similarly, a large gate width can reduce the total on-resistance in the transistor device but concurrently would increase parasitic gate capacitance, which causes increased transistor switching losses. Hence, a transistor design, in practice, often involves a trade-off with regard to certain key design parameters in order to strike a compromise among the various performance attributes.

One important performance parameter for determining transistor device efficiency and reliability is Miller capacitance, or gate-to-drain capacitance. As required by an ever-increasing demand for higher efficiency, the trend is for power MOSFET designs to scale towards smaller gate dimensions and therefore lower gate charge ($Q_g$) and lower threshold voltage ($V_t$) values that make the device more vulnerable to drain voltage spikes due to Miller capacitance coupling effects. At the same time, higher transistor switching frequencies, along with increased parasitic inductance, results in increased drain voltage ringing. These combined effects make modern power transistor devices prone to drain voltage induced false turn-on that can damage the device. Additionally challenging is the fact that Miller capacitance is particularly challenging to reduce and often leads to increased device on-resistance as a design compromise. Common methods for reducing parasitic gate-to-drain capacitance inevitably leads to higher device on-resistance, and therefore lowering Miller capacitance in a power transistor device is perhaps one of the most difficult design objectives to achieve and yet critically needed for product performance and application reliability.

SUMMARY

The present invention, as manifested in one or more embodiments, beneficially provides an enhanced gate structure for use in an LDMOS transistor device, and methods for fabricating such a device. This gate structure is advantageously compatible with existing complementary metal-oxide semiconductor (CMOS) fabrication technology and does not rely on the use of esoteric and costly processes and materials, such as, for instance, silicon carbide (SiC), gallium nitride (GaN), and the like, to achieve a substantial reduction in device on-resistance performance, without significantly degrading blocking voltage and reliability performance in the device.

In accordance with an embodiment of the invention, a metal-oxide-semiconductor field-effect transistor (MOSFET) device includes an epitaxial region of a first conductivity type disposed on an upper surface of a substrate, and at least two body regions of a second conductivity type formed in the epitaxial region, the second conductivity type being opposite in polarity to the first conductivity type. The body regions are disposed proximate an upper surface of the epitaxial region and spaced laterally from one another. The device further includes at least two source regions of the first conductivity type disposed in respective body regions, proximate an upper surface of the body regions, and a gate structure including at least two planar gates and a trench gate. Each of the planar gates is disposed on the upper surface of the epitaxial region and overlaps at least a portion of a corresponding body region. The trench gate is formed partially through the epitaxial region and between the body regions. A drain contact disposed on a back surface of the substrate provides electrical connection with the substrate.

In accordance with an embodiment of the invention, a method of fabricating a MOSFET device includes: forming an epitaxial region of a first conductivity type on an upper surface of a substrate of the first conductivity type; forming at least two body regions of a second conductivity type in the epitaxial region, the second conductivity type being opposite in polarity to the first conductivity type, the body regions being disposed proximate an upper surface of the epitaxial region and spaced laterally from one another; forming at least two source regions of the first conductivity type, each of the source regions being disposed in a corresponding one of the body regions proximate an upper surface of the body region; forming a gate structure including at least two planar gates and a trench gate, each of the planar gates being disposed on the upper surface of the epitaxial region and overlapping at least a portion of a corresponding body region, the trench gate being formed at least partially through the epitaxial region between the body regions; and forming a drain contact on a back surface of the substrate and electrically connected with the substrate.

Techniques of the present invention can provide substantial beneficial technical effects. By way of example only and without limitation, an LDMOS according to one or more embodiments of the invention may provide one or more of the following advantages:

lower on-state resistance $R_{Ds-on}$
lower gate-to-drain (Miller) capacitance;
lower switching loss;
higher off-state blocking voltage.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein.

Figure 1A:
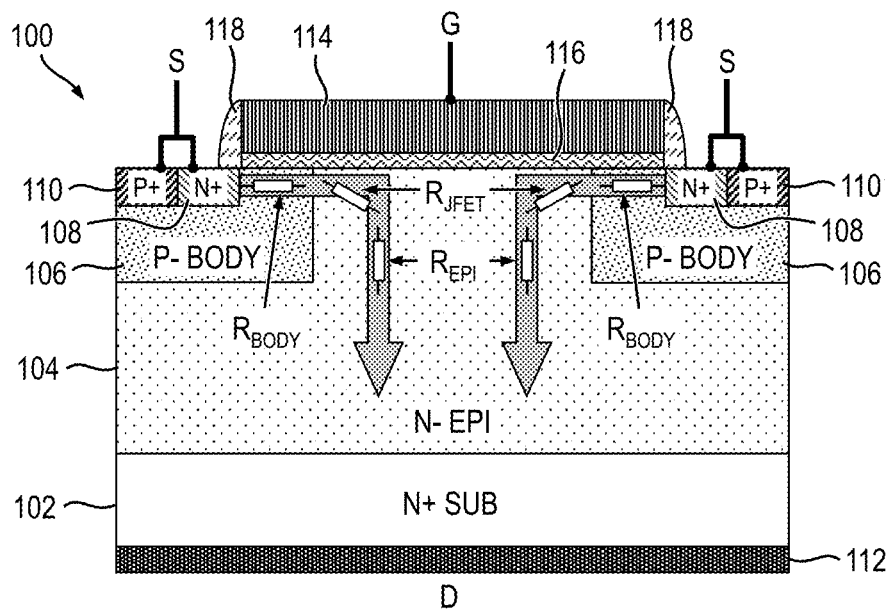
FIGS. 1A and 1B are cross-sectional views depicting at least a portion of an illustrative vertical double-diffused metal-oxide-semiconductor field-effect transistor (VDMOS-FET) device including on-state resistance and parasitic gate-to-drain capacitance components, respectively.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of an illustrative laterally-diffused metal-oxide-semiconductor (LDMOS) device, and methods for fabricating an LDMOS device, having enhanced high-frequency performance without significantly degrading power and linearity performance in the device. It is to be appreciated, however, that the invention is not limited to the specific device(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal material such as, for instance, polysilicon; the terms "MISFET" and "MOSFET" are used interchangeably herein.

Although the overall fabrication method and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

FIG. 1A is a cross-sectional view depicting at least a portion of an illustrative vertical double-diffused metal-oxide-semiconductor field-effect transistor (VDMOSFET) device 100. The VDMOSFET device 100 includes a substrate 102, which may be formed of single-crystalline silicon that is modified by adding an impurity or dopant (e.g., boron, phosphorus, arsenic, etc.) to change a conductivity of the material (e.g., n-type or p-type). In this example, the substrate 102 is of n-type conductivity and may thus be referred to as an n-substrate (N+ SUB).

An epitaxial region 104 is formed on an upper surface of the substrate 102. In this example, the epitaxial region 104 is modified by adding an impurity or dopant to be of n-type conductivity (N− EPI). The epitaxial region 104 in the VDMOSFET device 100 serves as a lightly-doped drift region in the device. Body regions 106, which in this embodiment are of p-type conductivity (P− BODY), are formed proximate an upper surface of the epitaxial region 104 and spaced laterally from one another. The VDMOSFET device 100 further includes source regions 108 formed in at least a portion of the respective body regions 106 proximate an upper surface of the body regions. The source regions 108 are preferably doped, such as by a conventional implant step, with an impurity of a known concentration level to selectively change the conductivity of the material as desired. In this example, the source regions 108 are of n-type conductivity (N+). Heavily-doped regions 110 having a conductivity type the same as the body region 106 (i.e., p-type in this example) are formed proximate the upper surface of the body regions 106, laterally adjacent to the respective source regions 108, to form body contacts of the VDMOSFET device 100. Each of the source regions 108 is electrically connected to a respective body contact 110.

In a VDMOSFET structure, the substrate 102 serves as a drain region in the device. A drain contact 112 is formed on a back surface of the substrate 102 to provide electrical connection with the substrate/drain 102.

A gate 114 is formed between the source regions 108 and above at least a portion of the body regions 106 and epitaxial drift region 104. A thin oxide layer 116 (e.g., silicon dioxide (SiO$_2$)), referred herein to as gate oxide, is formed under the gate 114 for electrically isolating the gate from the source regions 108, body regions 106 and epitaxial region 104 in the VDMOSFET device 100. Dielectric spacers 118 formed on sidewalls of the gate 114 and gate oxide layer 116 electrically isolate the gate from the source regions 108. As is well understood by those skilled in the art, a bias applied to the gate induces the formation of a channel in the body regions 106 under the gate for controlling a current flow between the source regions 108 and substrate 102 acting as a drain region.

The VDMOSFET device 100, whose planar gate structure on the surface of the device has certain advantages, among which include a simple fabrication process and good reliability in applications. However, VDMOSFET designs exhibit significant disadvantages, including having a high on-state resistance and large parasitic gate-to-drain (i.e., Miller) capacitance, which render such devices unsuitable for high-power, high-frequency applications. The large on-state resistance, $R_{ON}$, is attributable primarily to a combination of p-body channel resistance, $R_{BODY}$, which may be referred to as MOSFET channel resistance, junction field-effect transistor (JFET) channel resistance, $R_{JFET}$, and epitaxial drift region resistance, $R_{EPI}$, (i.e., $R_{ON}=R_{BODY}+R_{JFET}+R_{EPI}$), with $R_{EPI}$ being the dominant factor (e.g., greater than about 50 percent of the total on-resistance for a 100-volt device).

Figure 1B:
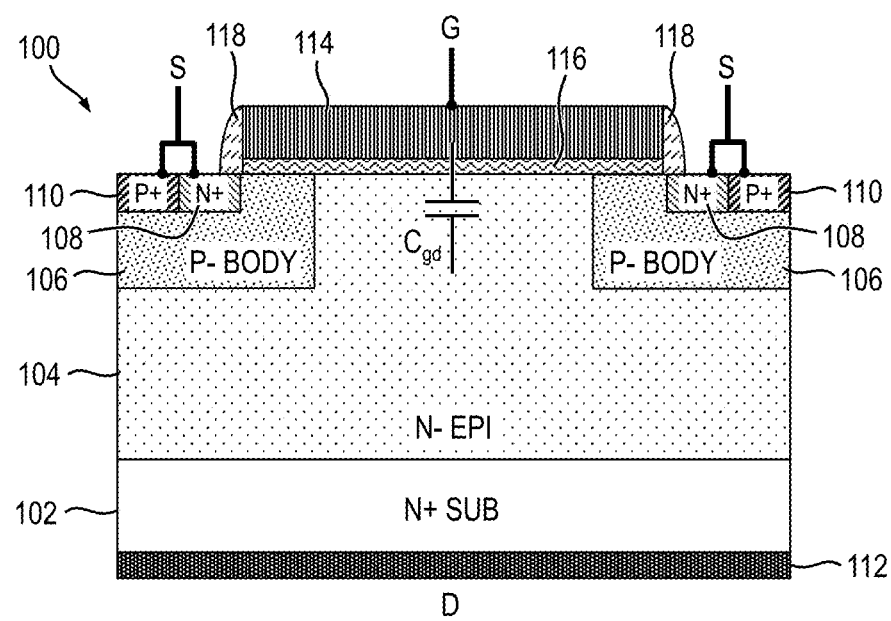

FIG. 1B is a cross-sectional view depicting at least a portion of the illustrative VDMOSFET device 100 shown in FIG. 1A including parasitic gate-to-drain (i.e., Miller) capacitance contribution. As apparent from FIG. 1B, the large parasitic gate-to-drain capacitance, $C_{gd}$, is attributable primarily to the large overlapping area between the gate 114 and epitaxial drift region 104. This large $C_{gd}$ component causes significant switching power loss during high-frequency applications, and is therefore undesirable.

There have been continual efforts to reduce on-state resistance, and thereby improve conductance, in a VDMOSFET device. In particular, it is desirable to increase a channel density in the VDMOSFET device 100 by reducing a lateral spacing of the body regions 106. However, with narrow body region spacing, a JFET effect will increase the resistance $R_{JFET}$ between the body regions 106, thus negating any benefits of increased channel density; there is always a trade-off between MOSFET channel resistance $R_{BODY}$ and JFET channel resistance $R_{JFET}$. Likewise, while JFET channel resistance can be reduced by increasing the doping concentration in the upper surface of the epitaxial region 104 (a JFET region), such a reduction in JFET channel resistance is offset with a reduced avalanche breakdown voltage during an off-state of the device, which is undesirable. In this regard, there have been attempts to increase the doping concentration in the epitaxial drift region 104 using a charge balancing approach to balance the positive charge in the n-type epitaxial drift region 104 and the negative charge in the p-type body region 106 during the off-state of the device for reducing the drift region on-state resistance $R_{EPI}$, but the doping concentration is limited to a certain level for a given dimension, usually lower than about $10^{17}/cm^3$.

Figure 2A:
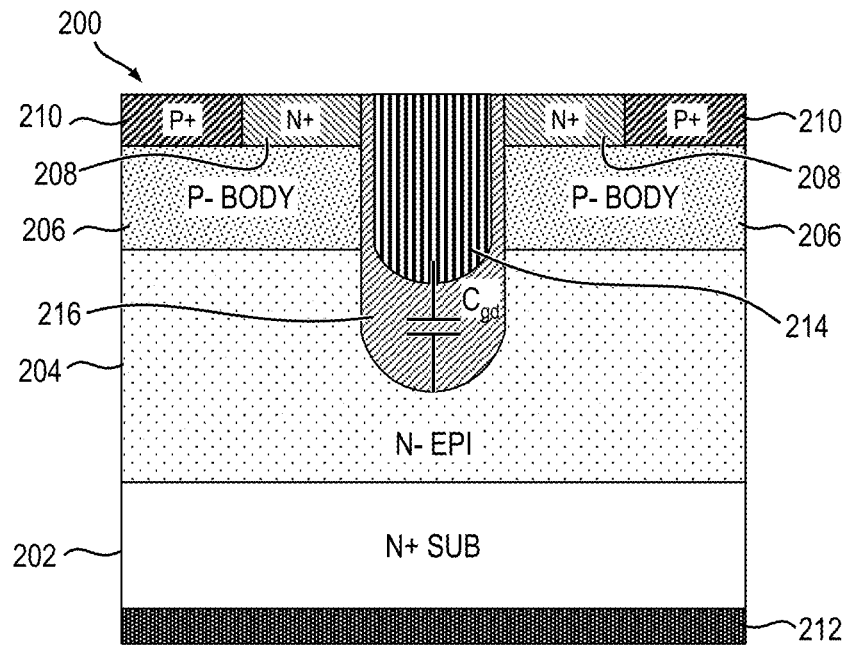
FIGS. 2A through 2C are cross-sectional views depicting at least a portion of exemplary trench gate MOSFET devices which exhibit reduced on-state resistance, and illustrating some effects of body region depth variation in the devices.
Figure 2B:
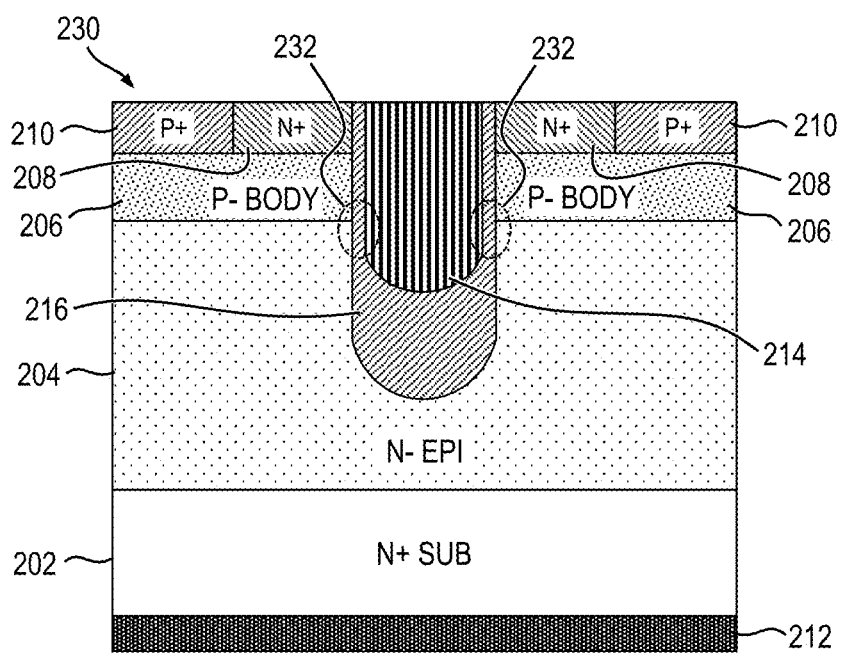
Figure 2C:
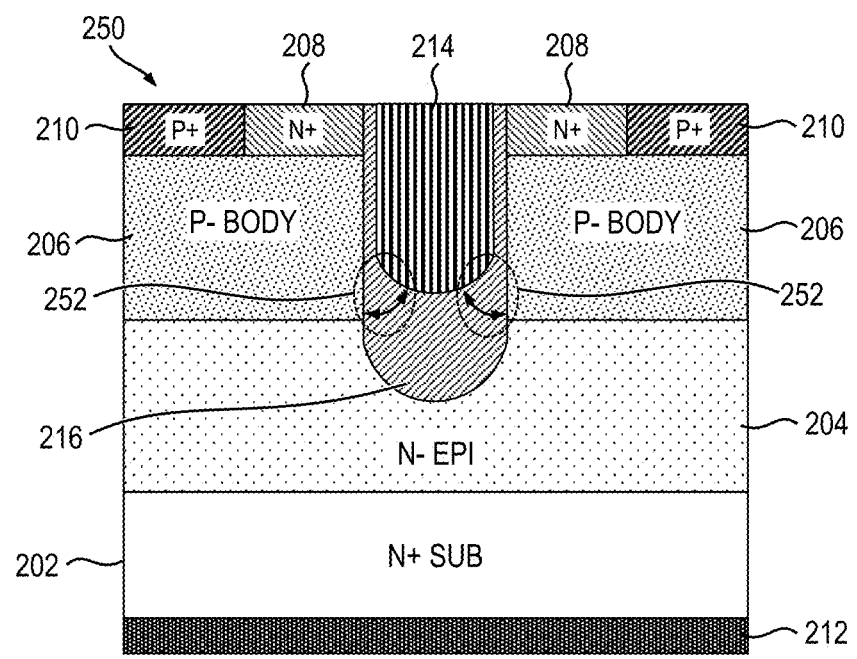

FIGS. 2A-2C, cross-sectional views depict at least a portion of exemplary trench gate MOSFET devices 200, 230 and 250, respectively, which exhibit reduced on-state resistance and conceptually illustrating the effects of body region depth variation in the devices. With reference to FIG. 2A, the trench gate MOSFET device 200 includes a substrate 202, which may be formed of single-crystalline silicon that is modified by adding an impurity or dopant of n-type conductivity and may thus be referred to as an n-substrate (N+ SUB). An epitaxial region 204 is formed on an upper surface of the substrate 202. In this example, the epitaxial region 204 is modified by adding an impurity or dopant of n-type conductivity (N− EPI). The epitaxial region 204 in the MOSFET device 200, similar to the VDMOSFET device 100 shown in FIG. 1A, serves as a lightly-doped drift region in the device. Body regions 206, which in this embodiment are of p-type conductivity (P− BODY), are formed proximate an upper surface of the epitaxial region 204 and spaced laterally from one another. The MOSFET device 200 further includes source regions 208 formed in at least a portion of the respective body regions 206 proximate an upper surface of the body regions. The source regions 208 are preferably doped with an n-type impurity to form source regions 208 of n-type conductivity (N+). Heavily-doped regions 210 having a p-type conductivity, in this example, are formed proximate the upper surface of the body regions 206, laterally adjacent to the respective source regions 208, to form body contacts of the MOSFET device 200. Thus, each of the source regions 208 is electrically connected to a respective body contact 210.

Like the VDMOSFET device 100 depicted in FIG. 1A, in the MOSFET device 200, the substrate 202 serves as a drain region in the device. A drain contact 212 is preferably formed on a back surface of the substrate/drain 202 and provides electrical connection with the substrate/drain.

The MOSFET device 200 further includes a trench gate 214, which may comprise polysilicon, formed through the upper surface of the epitaxial region 204 between the body regions 206 and source regions 208. The trench gate 214 may be fabricated by forming a channel (i.e., trench) partially through the epitaxial region 204 between the body regions 206 and source regions 208 and filling the channel with a dielectric material 216. The dielectric material is preferably an oxide, such as silicon dioxide. The trench gate 214 is then formed partially through the dielectric material 216, extending vertically past the source regions 208 and body regions 206. A thickness of the dielectric material 216 surrounding sidewalls of the trench gate 214 is preferably just enough to prevent direct electrical contact between the trench gate 214 and the adjacent source regions 208 and body regions 206.

In contrast to the planar gate arrangement found in the VDMOSFET device 100 shown in FIG. 1A, the trench gate MOSFET device 200 provides advantages of having lower on-state resistance by elimination of the JFET resistance component $R_{JFET}$. However, the parasitic gate-to-drain (Miller) capacitance $C_{gd}$ is still significantly high. The gate-to-drain capacitance $C_{gd}$ can be reduced somewhat by increasing a thickness of the dielectric material 216 at a bottom of the trench, as demonstrated in the exemplary trench gate MOSFET device 230 shown in FIG. 2B. The trench gate MOSFET device 230 is essentially the same as the device 200 shown in FIG. 2A except that the body regions 206 have a slightly reduced depth into the epitaxial drift region 204. While the device 230 exhibits reduced parasitic gate-to-drain capacitance $C_{gd}$, weak points 232 are created between bottom corners of the polysilicon trench gate 214 and the epitaxial region 204, which undesirably results in reduced device breakdown voltage.

Further complicating the difficulty in a channel formation process within the body regions 206 is that a depth of the body regions in the epitaxial region 204 must be tightly controlled with respect to a depth of the trench gate 214. The body regions 206 cannot be too shallow as this results in the formation of weak spots 232 for early breakdown at high blocking voltages, as evidenced by the MOSFET device 230 depicted in FIG. 2B. Similarly, as demonstrated by an exemplary trench gate MOSFET device 250 shown in FIG. 2C, the body regions 206 cannot be formed too deep in the epitaxial region 204, as this would undesirably increase the gate oxide thickness proximate a bottom of the trench gate 214, as represented by thick oxide areas 252 in FIG. 2C. The thick oxide areas 252 in the trench gate MOSFET device 250 reduce gate control over the channel formed in the body regions 206, thereby making the device difficult to turn on; that is, the MOSFET device 250 will exhibit an undesirable increase in device threshold voltage.

Figure 3A:
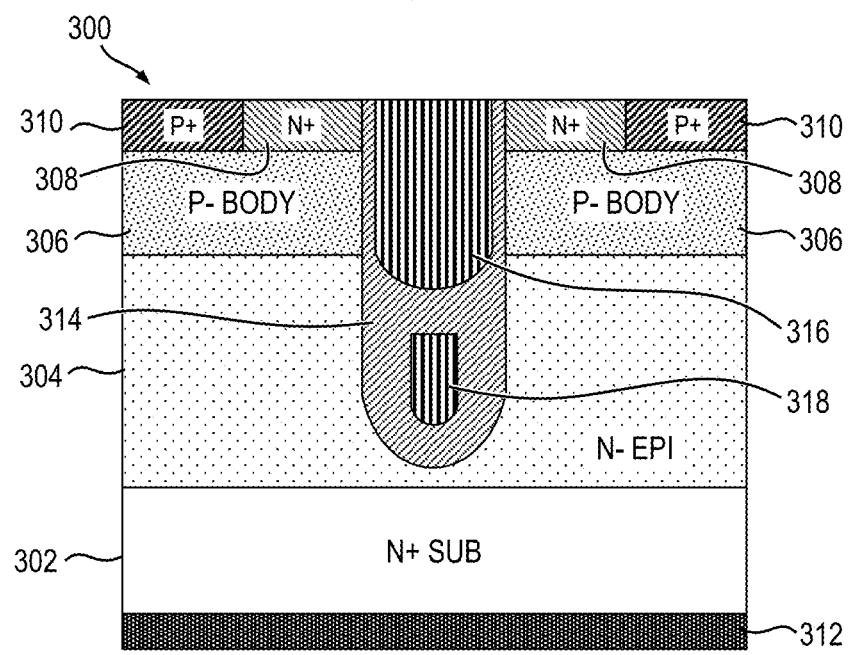
FIGS. 3A through 3C are cross-sectional views depicting at least a portion of exemplary split trench gate MOSFET devices which exhibit reduced parasitic gate-to-drain capacitance and increased off-state blocking voltage, and illustrating some effects of body region depth variation in the devices.
Figure 3B:
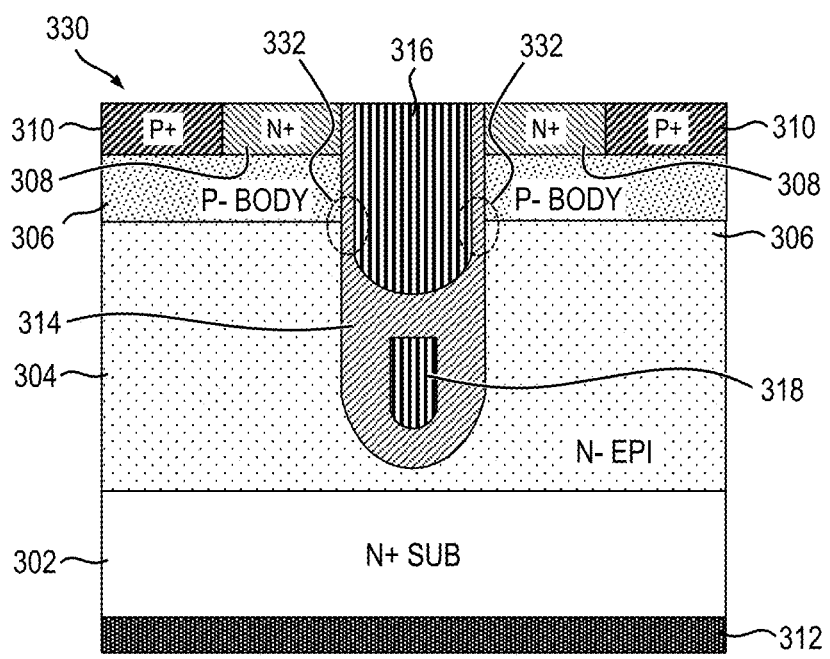
Figure 3C:
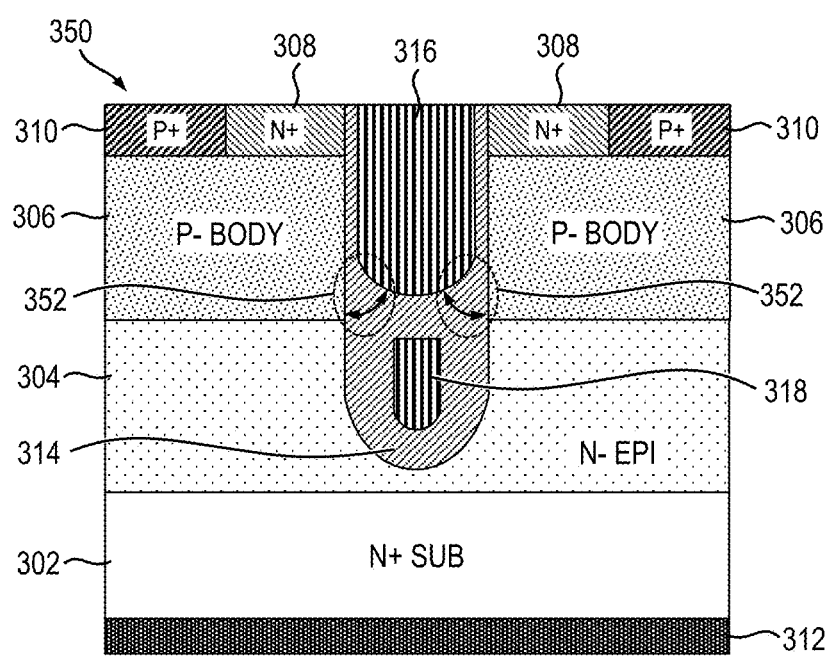

FIGS. 3A-3C are cross-sectional views depicting at least a portion of exemplary split trench gate MOSFET devices 300, 330 and 350, respectively. With reference to FIG. 3A, the split trench gate MOSFET device 300 includes a substrate 302, which may be formed of single-crystalline silicon that is modified by adding an impurity or dopant of n-type conductivity and may thus be referred to as an n-substrate (N+ SUB). An epitaxial region 304 is formed on an upper surface of the substrate 302. In this example, the epitaxial region 304 is modified by adding an impurity or dopant of n-type conductivity (N− EPI). The epitaxial region 304 in the MOSFET device 300, similar to the VDMOSFET device 100 shown in FIG. 1A and the trench gate MOSFET device 200 shown in FIG. 2A, serves as a lightly-doped drift region in the device. Body regions 306, which in this embodiment are of p-type conductivity (P− BODY), are formed proximate an upper surface of the epitaxial region 304 and spaced laterally from one another. The MOSFET device 300 further includes source regions 308 formed in at least a portion of the respective body regions 306 proximate an upper surface of the body regions. The source regions 308 are preferably doped with an n-type impurity to form source regions 308 of n-type conductivity (N+). Heavily-doped regions 310 having a p-type conductivity, in this example, are formed proximate the upper surface of the body regions 306 and laterally adjacent to the respective source regions 308, to form body contacts of the MOSFET device 300. Thus, each of the source regions 308 is electrically connected to a respective body contact 310.

Like the VDMOSFET device 100 depicted in FIG. 1A and the trench gate MOSFET 200 shown in FIG. 2A, the substrate 302 in the split trench gate MOSFET device 300 serves as a drain region in the device. A drain contact 312 is preferably formed on a back surface of the substrate/drain 302 and provides electrical connection with the substrate/drain.

The MOSFET device 300 further includes a dielectric trench 314, filled with a dielectric material (e.g., silicon dioxide), extending vertically in the epitaxial region 304 between the body regions 306 and source regions 308. A trench gate 316, which may comprise polysilicon, is formed in the dielectric trench 314 to a depth just below a bottom of the body regions 306. A shield gate 318 is also formed in the trench 314 vertically beneath the trench gate 316. The shield gate 318 is electrically isolated from the trench gate 316 and the epitaxial region 304 by the dielectric material in the trench 314. In this example, the trench gate 316 is slightly wider than the shield gate 318, so that the shield gate is surrounded by a thicker layer of dielectric material compared to the trench gate. The shield gate 318 is preferably connected to the source regions 308

The shield gate 318 helps reduce the parasitic gate-to-drain capacitance $C_{gd}$ and increases off-state blocking voltage in the MOSFET device 300. However, any improvements offered by this split trench gate MOSFET design are only available in an off-state of the device; that is, there is essentially no improvement in on-state performance where maximum dopant concentration is dictated by a required breakdown voltage in the device. The split trench gate design suffers a similar difficulty in precisely controlling a depth and thickness of the body regions 306.

For example, FIG. 3B depicts a split trench gate MOSFET device 330 having shallow body regions 306. As previously explained in conjunction with FIG. 2B, shallow body regions 306 in the MOSFET device 330 will create weak areas 332 proximate bottom corners of the trench gate 316, which causes early breakdown in the device at high blocking voltages. Likewise, FIG. 3C illustrates a split trench gate MOSFET device 350 having deep body regions 306, such that a bottom of the body regions extends below a bottom of the trench gate 316. As previously explained in conjunction with FIG. 2C, deep body regions 306 in the MOSFET device 350 will create thick oxide areas 352 proximate bottom corners of the trench gate 316, which undesirably reduces gate control over a channel formed in the body regions 306, thereby increasing device threshold voltage and making the device difficult to turn on.

Figure 4A:
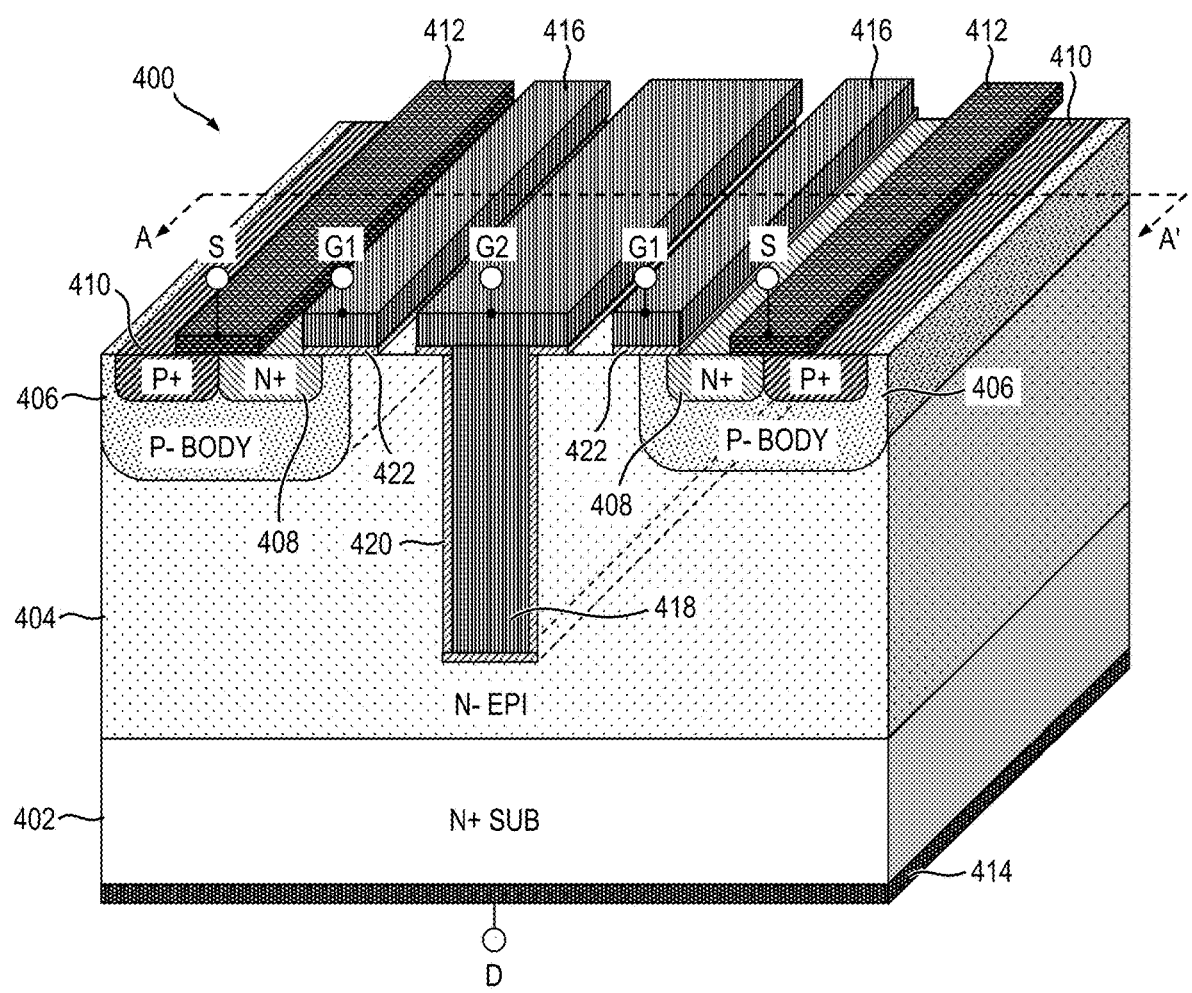
FIG. 4A is a perspective view depicting at least a portion of an exemplary super gate MOSFET device, according to an embodiment of the present invention.
Figure 4B:
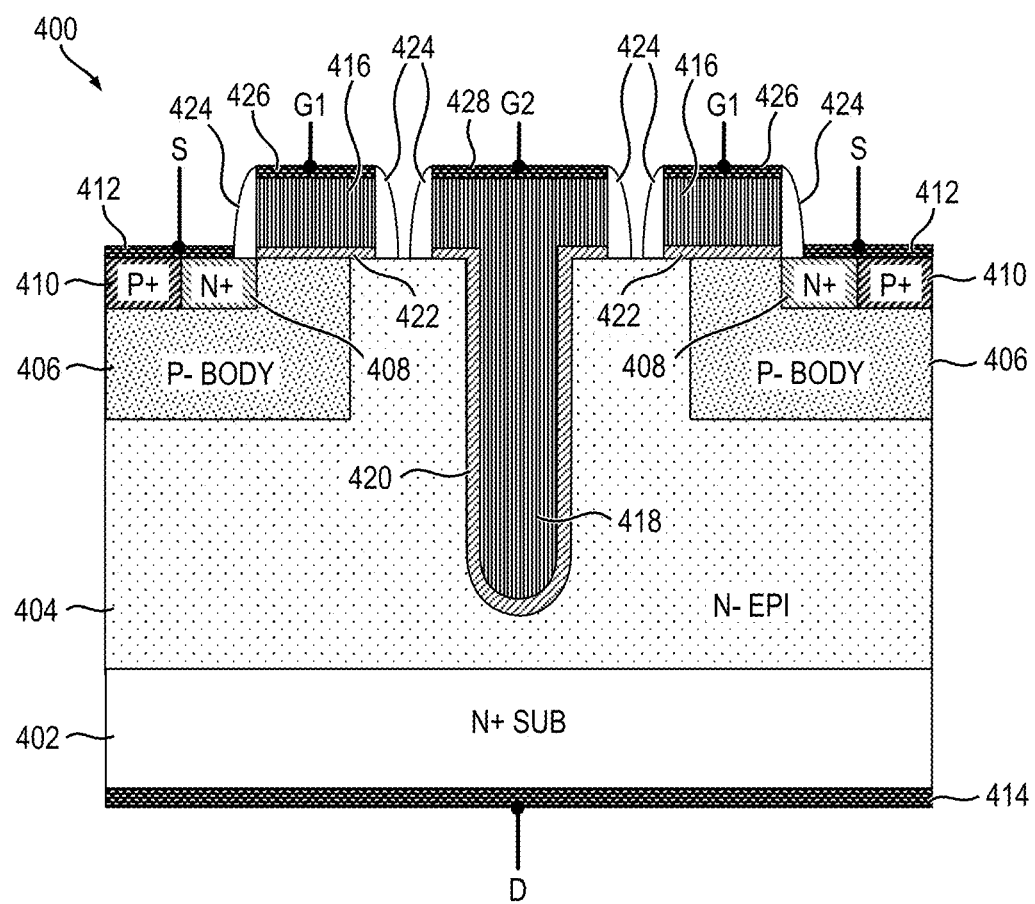
FIG. 4B is a cross-sectional view depicting the exemplary super gate MOSFET device shown in FIG. 4A, taken along line A-A'.

The present invention, as manifested in one or more embodiments, exploits the beneficial characteristics of both planar gate and trench gate structures to provide a MOSFET device having what is referred to herein as a super gate structure which advantageously achieves enhanced high-frequency performance without significantly degrading power and linearity performance in the device. With reference to FIGS. 4A and 4B, perspective and cross-sectional views, respectively, depict at least a portion of an exemplary super gate MOSFET device 400, according to an embodiment of the invention.

The MOSFET device 400 includes a substrate 402, which may be formed of single-crystalline silicon (e.g., having a <100> or <111> crystal orientation) that is modified by adding an impurity or dopant (e.g., boron, phosphorous, arsenic, antimony, etc.) of a desired conductivity (n-type or p-type) and doping level. A p-substrate may be formed by adding a p-type impurity or dopant (e.g., Group III elements, such as boron) of a prescribed concentration level (e.g., about $10^{14}$ to about $10^{18}$ atoms per cubic centimeter) to the substrate material, such as by using a diffusion or implant step, to change the conductivity of the material as desired. In other embodiments, an n-substrate may be formed by adding an n-type impurity or dopant (e.g., Group V elements, such as phosphorus) of a prescribed concentration level to the substrate material. In this exemplary embodiment, the substrate 402 is doped to have n-type conductivity, and may thus be referred to as an n-substrate (N+ SUB). Other materials for forming the substrate 402 are similarly contemplated, such as, but not limited to, germanium, gallium arsenide, silicon carbide, gallium nitride, indium phosphide, etc.

An epitaxial region 404 is formed on an upper surface of the substrate 402. In this embodiment, the epitaxial region 404 is modified by adding an impurity or dopant of n-type conductivity (N− EPI), although a p-type epitaxial is similarly contemplated (e.g., by adding a p-type dopant). The epitaxial region 404 in the MOSFET device 400, similar to the VDMOSFET device 100 shown in FIG. 1A and the trench gate MOSFET device 200 shown in FIG. 2A, serves as a lightly-doped drift region in the device. Body regions 406, which in this embodiment are of p-type conductivity (P− BODY), are formed proximate an upper surface of the epitaxial region 404 and spaced laterally from one another. The body regions 406 in this exemplary embodiment may be formed by implanting a p-type impurity (e.g., boron) into a defined area of the epitaxial region 404 using standard complementary metal-oxide semiconductor (CMOS) fabrication techniques. The body regions 406 are preferably more heavily doped relative to the doping level of the substrate, such as, for example, about $5 \times 10^{16}$ atoms/cubic centimeter (cm$^3$) to about $1 \times 10^{18}$ atoms/cm$^3$. In one or more alternative embodiments where a p-type epitaxial region is employed, the body regions 406 may comprise an n-type well that is formed using similar CMOS fabrication techniques.

The MOSFET device 400 further includes source regions 408 formed in at least a portion of the respective body regions 406 proximate an upper surface of the body regions. The source regions 408 are preferably doped with an impurity having a conductivity type that is opposite the conductivity type of the body regions 406. In this exemplary embodiment, the source regions 408 are of n-type conductivity (N+). Heavily-doped regions 410 having a p-type conductivity, in this example, are formed proximate the upper surface of the body regions 406 and laterally adjacent to the respective source regions 408, to form body contacts of the MOSFET device 400. Respective source (S) electrodes 412 electrically connect each of the source regions 408 to a corresponding body contact 410.

In the MOSFET device 400, similar to the VDMOSFET device 100 depicted in FIG. 1A, the substrate 402 serves as a drain region in the device. A drain (D) electrode 414 is preferably formed on a back surface of the substrate/drain 402 and provides electrical connection with the substrate/drain. In contrast to a standard lateral MOSFET device, where the drain and source electrodes are both formed on the upper surface of the device, the drain electrode 414 of the MOSFET device 400, formed on the back surface of the device, is on an opposite side of the source electrodes 412, formed on the upper surface of the device; that is, the drain electrode 414 and source electrodes 412 are disposed on vertically opposing surfaces of the MOSFET device 400 relative to one another.

The MOSFET device 400 further includes a gate structure that comprises at least two portions: a planar gate (G1) 416 and a trench gate (G2) 418. In this illustrative embodiment, there are two planar gates 416 disposed on either side of the trench gate 418. The planar gates 416 and trench gate 418 are preferably formed as fingered (i.e., stripped) structures that are physically separated from one another, although the planar and trench gates are electrically connected at one or both ends of the fingers (not explicitly shown, but implied). In one or more alternative embodiments, the planar gates 416 and trench gate 418 may form a contiguous gate structure having planar and trench gate functionality, as will be described in further detail herein below in conjunction with FIG. 6.

In one or more embodiments, the trench gate 418, which may comprise polysilicon, is formed substantially vertically through the upper surface of the epitaxial region 404 between the body regions 406 and source regions 408, such that there is a source region 408 on both sides of the trench gate 418. More particularly, the trench gate 418 may be fabricated by forming an opening (e.g., trench or channel) partially through the epitaxial region 404 between the body regions 406 and source regions 408 and filling the opening with a dielectric material 420. In one or more embodiments, the dielectric material 420 is an oxide, such as silicon dioxide, although the invention is not limited to any specific electrically-insulating materials. The trench gate 418 is then formed partially through the dielectric material 420, extending vertically below the source regions 408 and body regions 406. The dielectric material 420 thus electrically isolates the trench gate 418 from the surrounding epitaxial region 404, thereby preventing direct electrical contact between the trench gate 418 and the adjacent source regions 408 and body regions 406, and may therefore be referred to as a trench gate oxide layer.

In one or more embodiments, each of the planar gates 416 is disposed on the upper surface of the epitaxial region 404, overlapping at least a portion of a corresponding body region 406. A dielectric layer 422 is formed between each of the planar gates 416 and the upper surface of the body regions 406 and epitaxial region 404 to electrically isolate the planar gates 416 from the body and epitaxial regions, and may therefore be referred to as planar gate oxide layers. Although not explicitly shown in FIG. 4A, dielectric spacers 424 are preferably formed on sidewalls of the planar gates 416 and a portion of the trench gate 418 extending on the upper surface of the epitaxial layer 404, as depicted in FIG. 4B. With reference to FIG. 4B, the gate sidewall spacers 424 electrically isolate the planar gates from the trench gate, as well as electrically isolating the planar gates 416 from the respective source electrodes 412.

With continued reference to FIG. 4B, the MOSFET device 400 further includes first gate electrodes 426 in electrical connection with the planar gates 416, and a second gate electrode 428 in electrical connection with the trench gate 418. The gate electrodes 426 and 428 may be formed as metal silicide layers on at least a portion of an upper surface of the gates 416 and 418, respectively. As will be known by those skilled in the art, in gate silicide processing, a metal film (e.g., titanium, tungsten, platinum, cobalt, nickel, etc.) is deposited on the upper surface of the polysilicon gate and, through annealing whereby a reaction occurs between the deposited metal film and silicon in the polysilicon gate, a metal silicide contact is ultimately formed.

Figure 4C:
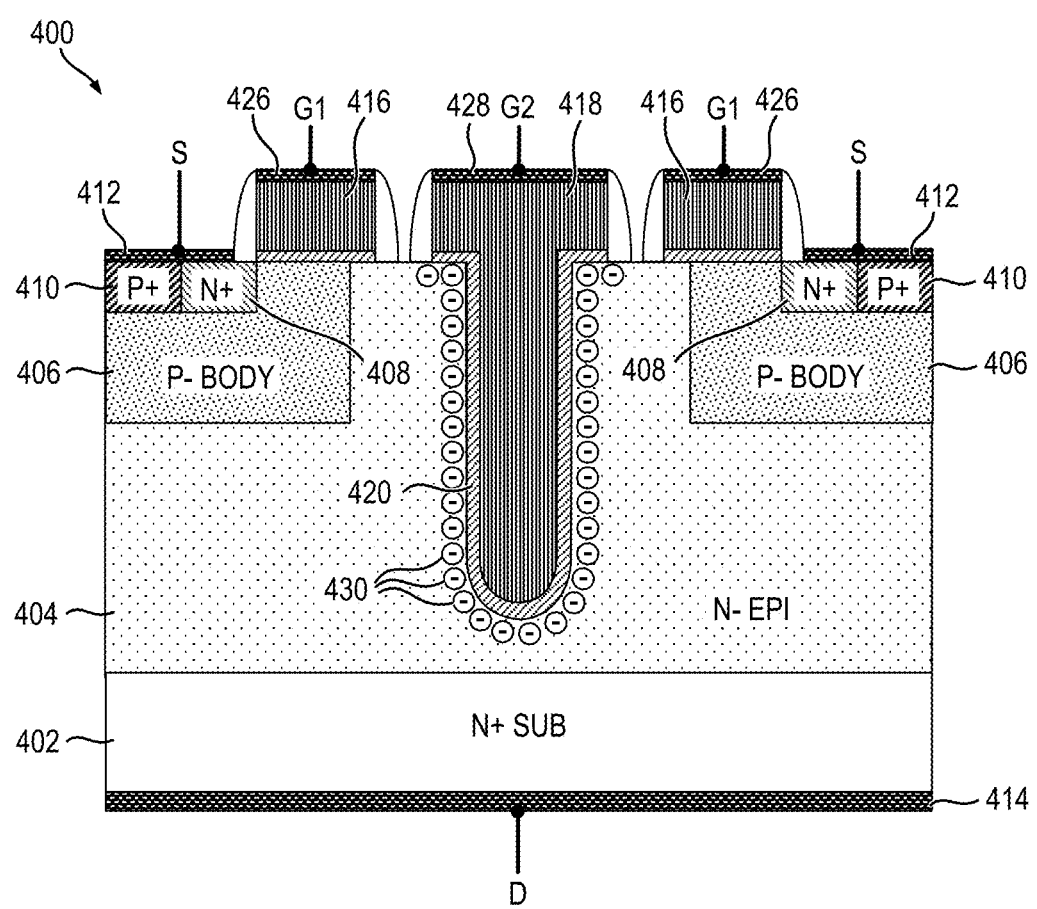
FIG. 4C is a cross-sectional view illustrating the super gate MOSFET device shown in FIG. 4B with an accumulation layer formed proximate the trench gate structure.

When biased positively above a threshold voltage for an n-channel MOSFET device, such as by applying a positive voltage potential between a given planar gate 416 and a corresponding source region 408, a channel is formed in the body region 406 underneath the planar gate, thereby turning on the MOSFET device 400. Concurrently, since the trench gate 418 is electrically connected to the planar gates 416, a positive bias will be applied to the trench gate thereby forming a strong accumulation layer 430 of majority carriers (e.g., electrons, in this example) in the epitaxial region 404 proximate a surface of the trench gate oxide layer 420, as depicted in FIG. 4C. This accumulation layer 430 beneficially increases a conductance of the MOSFET device 400 which allows the device to attain a very low on-state resistance, such as, for example, about two milliohms-square millimeter (2 mΩ-mm²) at a 30-volt blocking voltage rating. This super gate MOSFET device 400 achieves substantial performance improvements over conventional planar gate and trench gate devices, as will be demonstrated herein below.

Figure 5:
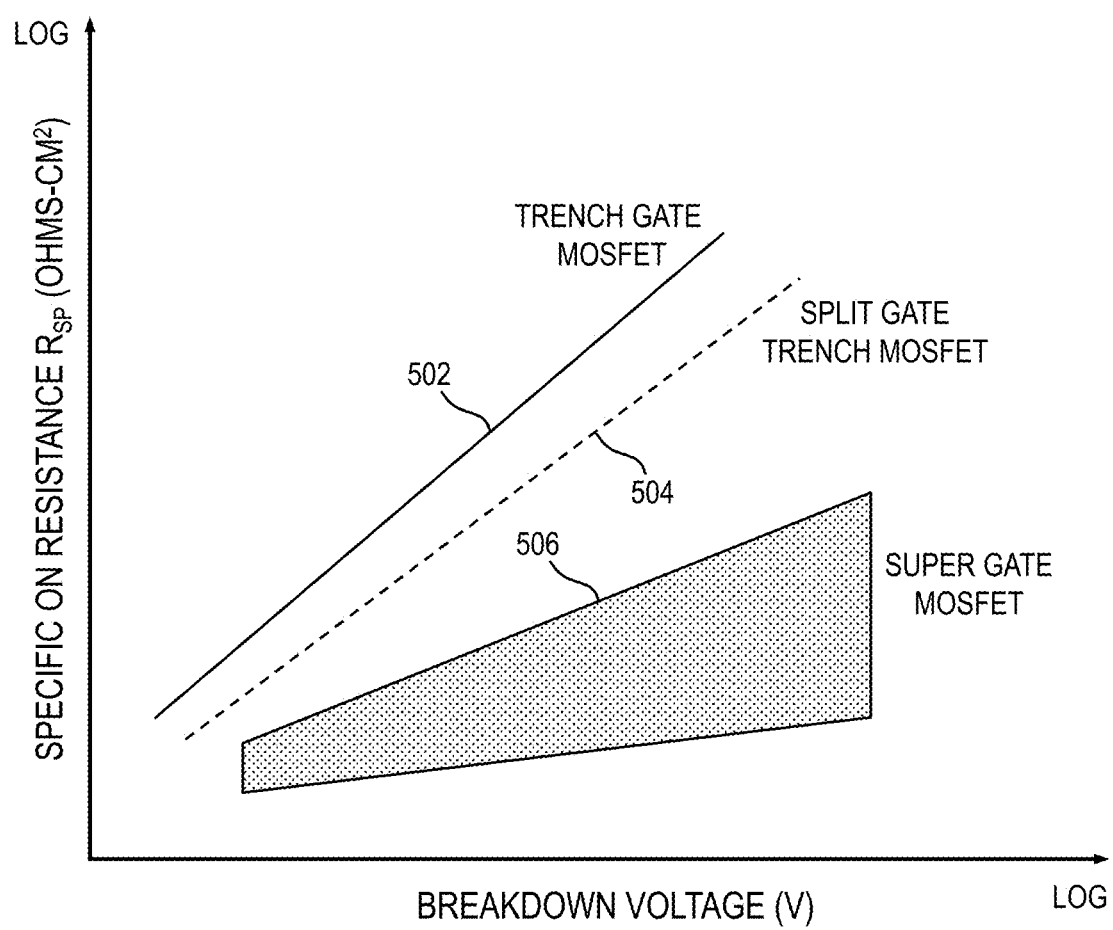
FIG. 5 is a graph conceptually depicting an exemplary comparison of specific on-state resistance $R_{SP}$ scaling relationship versus breakdown voltage for three different types of MOSFET devices.

FIG. 5 is a graph conceptually depicting an exemplary comparison of specific on-state resistance ($R_{SP}$) scaling relationship (in ohms-cm²) versus breakdown voltage (in volts) for three different types of MOSFET devices. Specifically, plot 502 represents the $R_{SP}$ scaling relationship versus breakdown voltage for a trench gate MOSFET device consistent with the illustrative trench gate MOSFET device 200 shown in FIG. 2A. Plot 504 represents the $R_{SP}$ scaling relationship versus breakdown voltage for a split gate trench MOSFET device consistent with the illustrative split gate trench MOSFET device 300 shown in FIG. 3A. Plot 506 represents the $R_{SP}$ scaling relationship versus breakdown voltage for a super gate MOSFET device formed according to one or more embodiments of the invention (e.g., super gate MOSFET device 400 shown in FIG. 4A). Ideally, a MOSFET device will exhibit both high breakdown voltage and low specific on-state resistance, although in practice these device characteristics are typically mutually exclusive; that is, a MOSFET device having very low on-state resistance will also have a very low breakdown voltage, and vice versa, as evidenced by plots 502 and 504 for the trench gate and split gate trench MOSFET devices, respectively.

As apparent from FIG. 5, the super gate MOSFET device (plot 506) formed according to embodiments of the invention exhibits at least two distinguishing advantages compared to either the trench gate MOSFET device (plot 502) or the split gate trench MOSFET device (plot 504). First, a slope of the $R_{SP}$ scaling relationship versus breakdown voltage is significantly reduced relative to plots 502 and 504; that is, compared to a trench gate MOSFET device or split gate trench MOSFET device at the same rated breakdown voltage, the specific on-state resistance of the super gate MOSFET device is significantly lower. As a result, a size of the chip can be made proportionally smaller, leading to a significant reduction in parasitic gate capacitance and gate-to-drain capacitance, which are proportional to chip size.

In general, the capacitance, C, of a parallel plate capacitor is defined according to the following expression:

$$C = \varepsilon_0 \varepsilon_r \frac{A}{d},$$

where $\varepsilon_0$ is absolute permittivity (i.e., the permittivity of a vacuum $\varepsilon_0$=8.854×10⁻¹² F/m), $\varepsilon_r$ is relative permittivity of the medium or dielectric material between the parallel plates, A is the surface area of a side of each of the parallel plates, and d is a distance between the plates (i.e., a thickness of the dielectric material between the plates). Thus, by reducing chip size, the surface area of one or both plates of the parasitic gate capacitor and/or parasitic gate-to-drain capacitor can be reduced. Reduction in the parasitic gate capacitance and gate-to-drain capacitance contributions advantageously results in a decrease in switching loss for high-frequency applications (e.g., synchronous DC-DC converters).

With continued reference to FIG. 5, a second distinguishing advantage of the super gate MOSFET device according to embodiments of the invention is that the super gate MOSFET device enables modulation of the specific on-state resistance during operation of the device, in contrast to having a fixed specific on-state resistance value in conventional MOSFET devices, as evidenced by the trapezoidal shape of plot 506. This is primarily due to the fact that in conventional MOSFET designs, the dopant concentration, and hence carrier concentration, is fixed after device manufacturing. By contrast, in the super gate MOSFET device according to one or more embodiments of the invention, the carrier concentration is not fixed but rather can be readily modulated as a function of the bias voltage applied to the trench (i.e., vertical) gate portion of the gate structure. This affords greater flexibility in the device design, a broader process window, and higher reliability during operation of the super gate MOSFET device, among other benefits.

Figure 6:
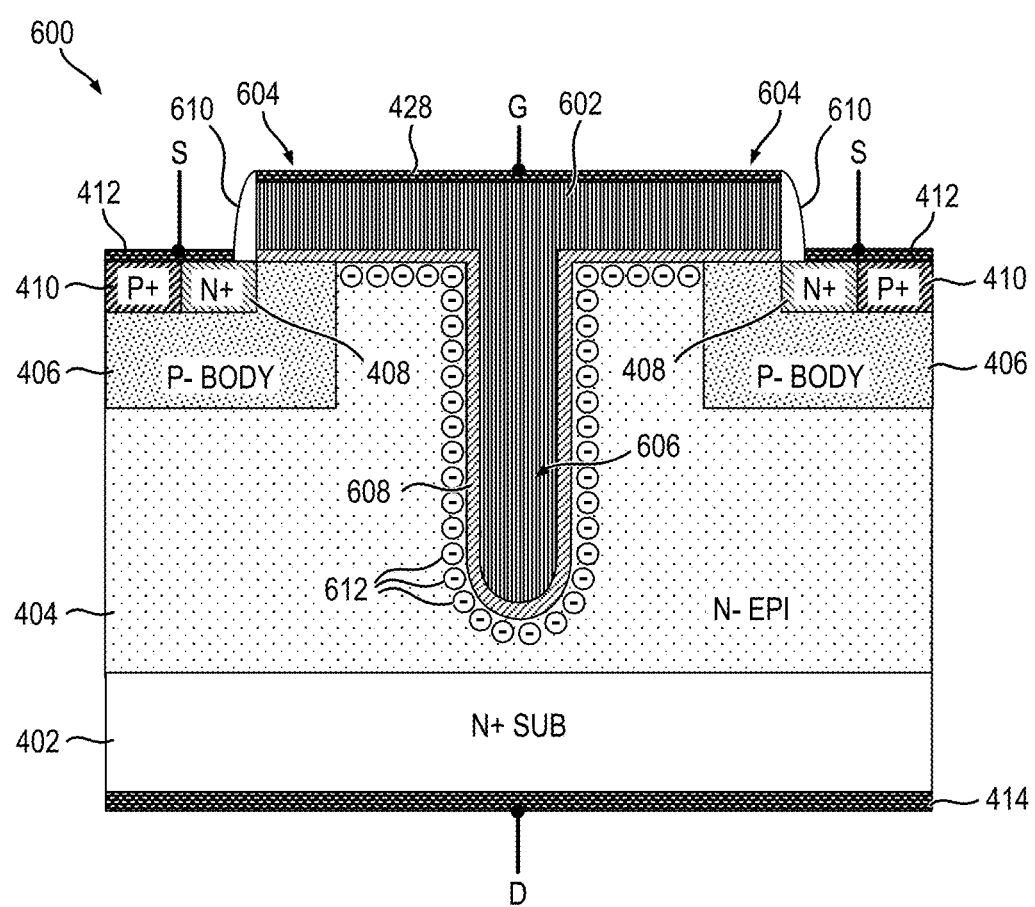
FIG. 6 is a cross-sectional view depicting at least a portion of an exemplary super gate MOSFET device, according to another embodiment of the present invention.

FIG. 6 is a cross-sectional view depicting at least a portion of an exemplary super gate MOSFET device 600, according to an alternative embodiment of the invention. More particularly, the super gate MOSFET device 600 is similar to the exemplary super gate MOSFET device 400 shown in FIGS. 4A and 4B, except that the MOSFET device 600 includes a simplified gate design, with the planar gates (416 in FIG. 4B) and trench gate (418 in FIG. 4B) merged together in the MOSFET device 600 to form a T-shaped gate 602 having planar gate and trench gate functionality. Specifically, the gate 602 includes planar gate portions 604 and a trench gate portion 606 formed as a contiguous structure.

The trench gate portion 606 extends vertically at least partially through the epitaxial region 404, between the two body regions 406. A depth of the trench gate portion 606 is preferably about 1-2 microns (μm), although embodiments of the invention are limited to any specific dimensions of the trench gate portion 606. The planar gate portions 604 originate at the trench gate portion 606 and extend in laterally opposing directions (i.e., horizontally) along the upper surfaces of the epitaxial region 404 and body regions 406, stopping at an edge of the respective source regions 408. An insulating layer 608 is formed underneath the gate 602 to electrically isolate the gate from adjacent structures and regions. Dielectric spacers 610 are preferably disposed on sidewalls of the gate 602 to prevent the gate from electrically contacting the source electrodes 412.

The planar and trench gate portions 604 and 606 preferably function in a manner consistent with the planar gates 416 and trench gate 418, respectively, in the exemplary MOSFET device 400 shown in FIG. 4B. More particularly, by applying a gate bias signal greater than a threshold voltage of the MOSFET device 600 between the gate 602 and source regions 408, each of the planar gate portions 604 will induce the formation of a channel in a corresponding body region 406 directly below the planar gate portion; when the applied gate bias signal falls below the device threshold voltage, the channel is essentially switched off. At the same time, the applied gate bias signal will cause the trench gate portion 606 to form a strong accumulation layer 612 of majority carriers proximate the gate oxide layer 608 following a contour of the trench gate portion. As previously explained, this strong accumulation layer 612 will increase a conductance of the MOSFET device 600, even with a narrow space between the body regions 406, thereby decreasing device on-state resistance. Connecting the gate 602 to the source electrodes 412 turns off the channel inside the body regions 406, thus turning off the MOSFET device 600.

Figure 7A:
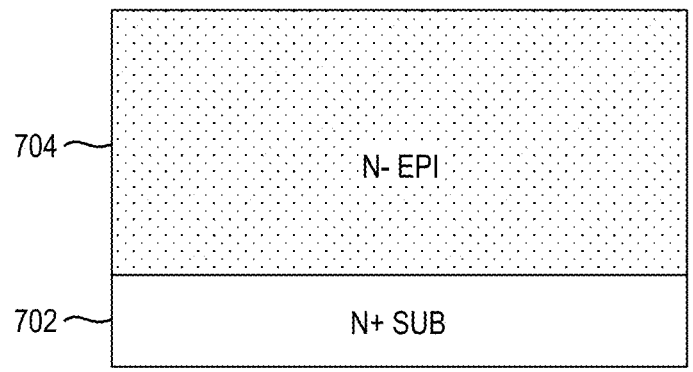
FIGS. 7A through 7I are cross-sectional views depicting at least a portion of exemplary processing steps in the fabrication of the exemplary super gate MOSFET device shown in FIG. 4B, according to an embodiment of the present invention.

By way of example only and without limitation, FIGS. 7A through 7I are cross-sectional views depicting at least a portion of exemplary intermediate processing steps in the fabrication of the exemplary super gate MOSFET device 400 shown in FIG. 4B, according to an embodiment of the invention. With reference to FIG. 7A, the illustrative fabrication process starts with a substrate 702, which in one or more embodiments comprises single-crystalline silicon or an alternative semiconductor material, such as, but not limited to, germanium, silicon germanium, silicon carbide, gallium arsenide, gallium nitride, or the like. In this illustrative embodiment, the substrate 702 is doped with an n-type impurity or dopant (e.g., phosphorus, etc.) to form an n-type conductivity substrate (N+ SUB). Embodiments of the invention are also contemplated in which a p-type conductivity substrate is employed. The substrate 702 preferably undergoes cleaning and surface treatment.

An epitaxial layer 704 is then formed on an upper surface of the substrate 702, such as by an epitaxial growth process. In one or more embodiments, the epitaxial layer is of n-type conductivity (N− EPI), although a p-type conductivity epitaxial layer is similarly contemplated. The doping concentration of the epitaxial layer 704 is preferably less compared to the doping concentration of the substrate 702.

Figure 7B:
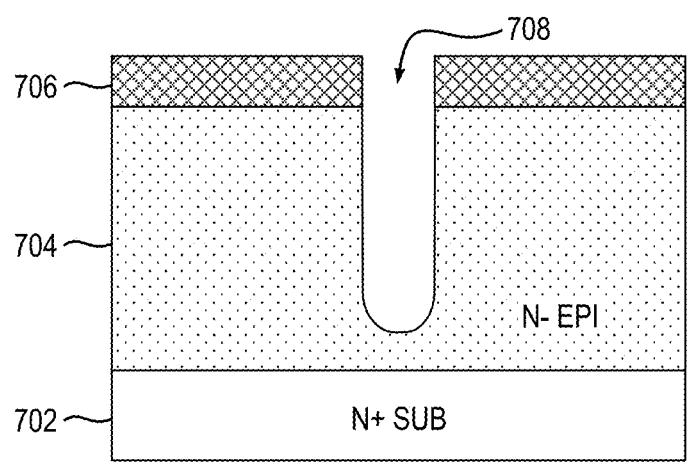
Figure 7C:
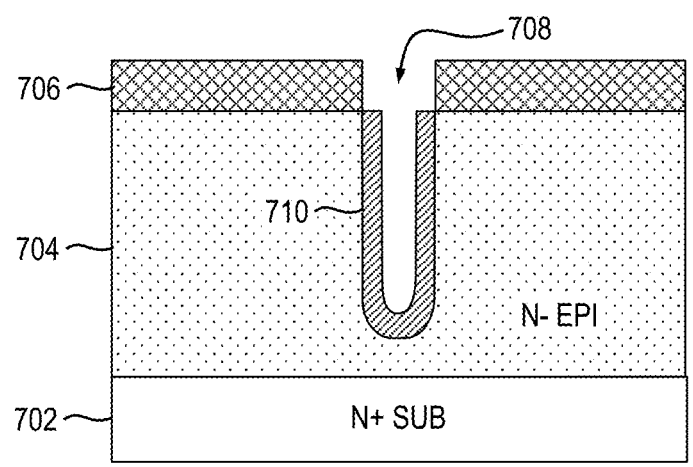

FIG. 7B shows the formation of a hard mask layer 706 on an upper surface of the epitaxial layer 704. In one or more embodiments, the hard mask layer 706, which may comprise silicon nitride, for example, is preferably formed using a standard deposition process. The hard mask layer 706 is then patterned (e.g., using standard photolithography and etching) and etched to form a trench 708 at least partially through the epitaxial layer 704. In one or more embodiments, reactive ion etching (RIE) is used to form the trench 708. This is followed by the formation of a first dielectric layer 710, which may be an oxide layer in one or more embodiments, on inside walls (e.g., sidewalls and bottom) of the trench 708, as shown in FIG. 7C. In one or more embodiments, the first dielectric layer 710 comprises silicon dioxide which is formed using a dry or wet oxidation process, although embodiments of the invention are not limited to any specific dielectric material. This first dielectric layer 710 will form a gate oxide of the trench gate (e.g., 418 in FIG. 4A) of the illustrative super gate MOSFET device.

Figure 7D:
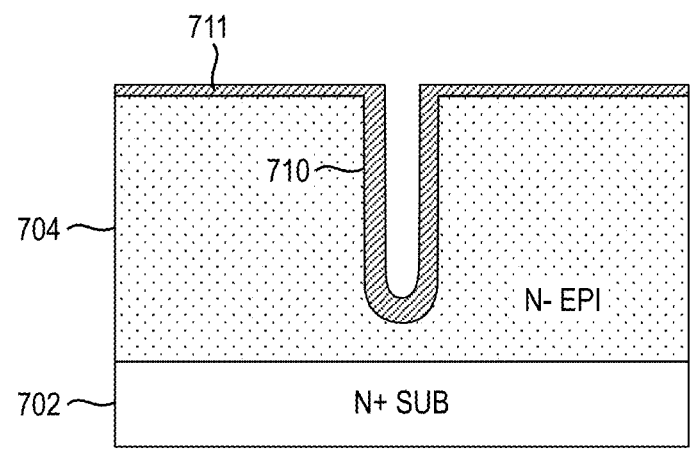

Referring now to FIG. 7D, the hard mask layer (706 in FIG. 7C) is removed, such as, for example, by using a wet or dry etch process (e.g., chemical or plasma etching). A second dielectric layer 711, which may be an oxide layer in one or more embodiments, is then formed on the upper surface of the epitaxial layer 704. This second dielectric layer 711 will form a gate oxide of the planar gates (e.g., 416 in FIG. 4A) of the super gate MOSFET device. The chemical reaction between oxygen and silicon to generate silicon dioxide forming the first and second dielectric layers 710, 711 is typically driven by a high-heat environment (e.g., about 800 degrees Celsius (° C.) to 1200° C.); however, even at room temperature, a thin layer of native oxide (e.g., about 1-3 angstrom (A) thick) can form in an ambient environment. In order to grow thicker oxides in a controlled environment, several known methods can be used, such as, for example, oxidation by in situ generated steam or a remote plasma source (e.g., remote plasma oxidation (RPO)).

Figure 7E:
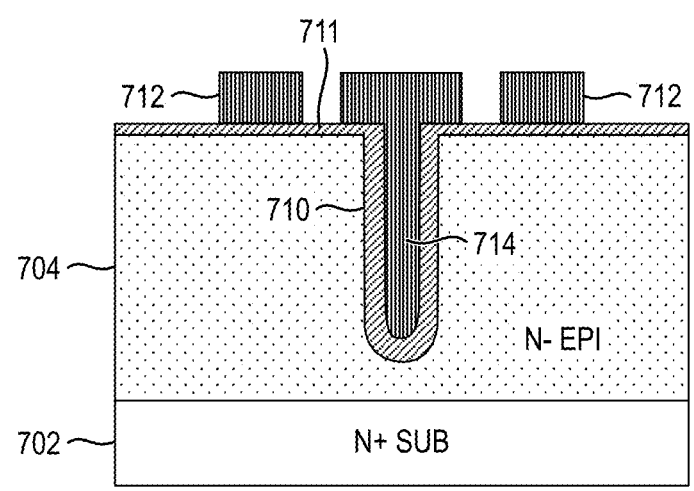

Next, a gate structure is formed including planar gates 712 and a trench gate 714, as shown in FIG. 7E. Each of the planar and trench gates 712, 714 preferably comprises polysilicon and is formed using a standard deposition process, followed by patterning (e.g., using standard photolithography and etching) and etching. In this illustrative embodiment, there are two planar gates 712 disposed on either side of the trench gate 714. Although not explicitly shown in FIG. 7E, the planar gates 712 and trench gate 714 are preferably formed as fingered (i.e., stripped) structures that are physically separated from one another, with the planar and trench gates being electrically connected at one or both (opposing) ends of the fingers. In one or more alternative embodiments, the planar gates 712 and trench gate 714 may form a contiguous gate structure having planar and trench gate functionality, as previously explained in conjunction with FIG. 6.

Figure 7F:
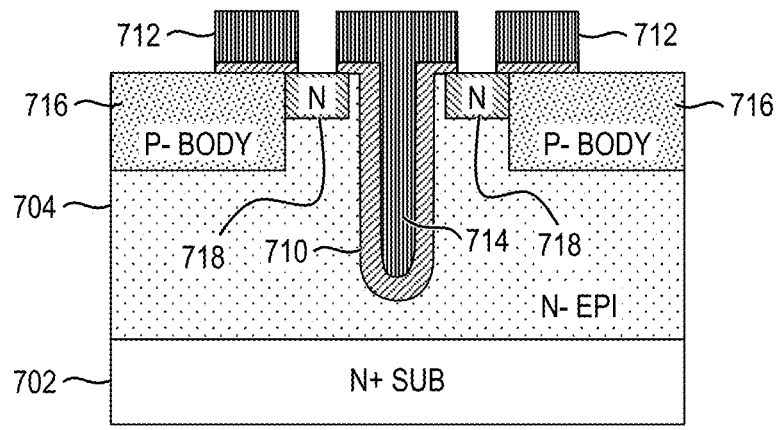

With reference to FIG. 7F, exposed portions of the second dielectric layer (711 in FIG. 7E) on the upper surface of the epitaxial layer 704 (i.e., portions of the second dielectric layer not covered by and extending beyond the planar gates 712 and trench gate 714) are removed, such as by using a standard selective etching process. Self-aligned body regions 716 are then formed in the epitaxial layer 704 proximate the upper surface of the epitaxial layer. In this exemplary embodiment, the body regions 716 are preferably formed by implanting a p-type dopant of a prescribed concentration level into the epitaxial layer 704, followed by heat treatment (e.g., annealing) to drive the dopant into the epitaxial layer.

Optionally, in the embodiment shown in FIG. 7F, implant regions 718 are preferably formed in the epitaxial layer 704, proximate the upper surface of the epitaxial layer and between the body regions 716 and trench gate 714. In one or more embodiments, the implant regions 718 are formed by implanting an n-type dopant of a prescribed concentration level into the epitaxial layer 704, between the planar gates 712 and trench gate 714. During implantation, the planar and trench gates are used as a mask. The implant regions 718 preferably serve to increase the n-type doping concentration level at the edge of the channel formed in the body regions 716, thereby reducing the on-resistance of the MOSFET device. The implant regions 718 also serve to limit the channel region under the gates 712 for improved high-frequency performance. In one or more embodiments, the implant regions 718 have a preferred doping concentration of about $1\times10^{16}$ to about $1\times10^{18}$ atoms/cm$^3$, although embodiments of the invention are not limited to any specific doping concentration.

Figure 7G:
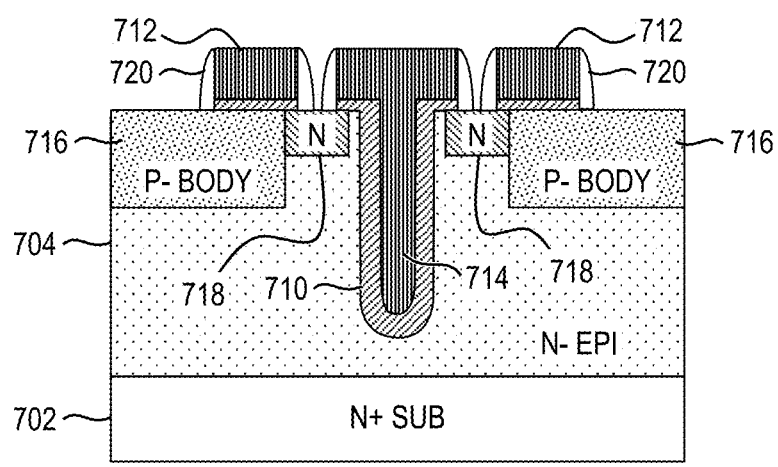

Dielectric spacers 720 are then formed on sidewalls of the planar gates 712 and trench gate 714, as shown in FIG. 7G. The dielectric spacers 720 may comprise silicon dioxide or silicon nitride in one or more embodiments, although the invention is not limited to any specific dielectric material. An etching process is performed to create a desired pattern for source region contacts (e.g., n-type) and body pick-up contacts (e.g., p-type) subsequently formed in the device.

Figure 7H:
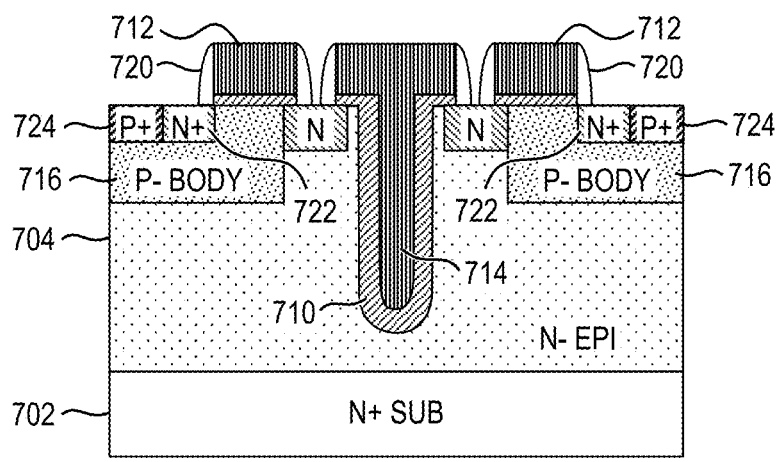

In FIG. 7H, source regions 722 are formed in the respective body regions 716, proximate an upper surface of the body regions and self-aligned to the planar gates 712. In this exemplary embodiment, the source regions 722 are of n-type conductivity formed, for example, using a standard implant process (e.g., ion implantation). Heavily-doped regions 724 having a p-type conductivity, in this example, are formed proximate the upper surface of the body regions 716, laterally adjacent to the respective source regions 722, to form body contacts of the super gate MOSFET device. Thus, each of the source regions 722 is electrically connected to a respective body contact 724.

Figure 7I:
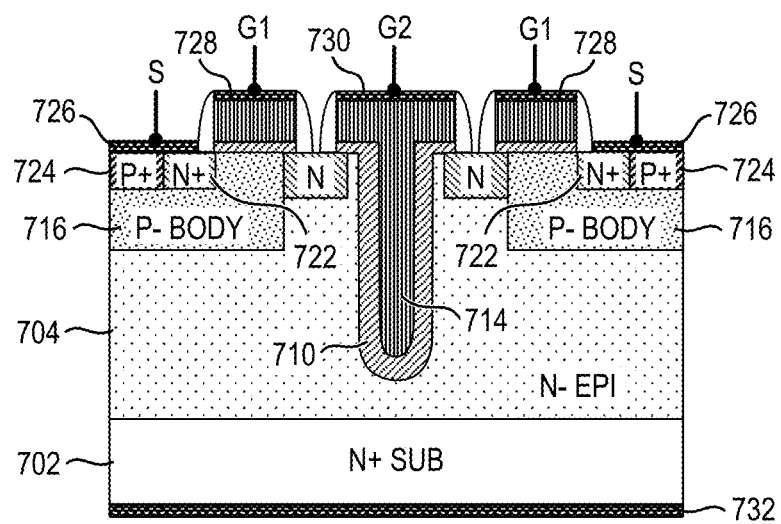

With reference now to FIG. 7I, a standard front-side silicidation process is used to form metal silicide contacts 726 at the source regions 722 and metal silicide contacts 728 and 730 at the planar gates and trench gate, respectively. As is well known, during a silicidation process, a blanket metal is deposited over an upper surface of the wafer and then a heat treatment (e.g., thermal anneal) is performed such that an alloy (metal silicide) is formed wherever the metal is in contact with exposed silicon. Unreacted metal is then removed, such as by using a standard etching process, with the resulting low-resistance silicide formed at the source and gate contacts. Front-side interconnect and passivation is then performed with metal (e.g., aluminum, etc.) and dielectric deposition and patterning during front-end-of-line (FEOL) processing. After FEOL processing has been completed, the wafer is flipped for back-side thinning (e.g., using CMP) and back-side metallization to form a drain contact 732 of the super gate MOSFET device.

Figure 8:
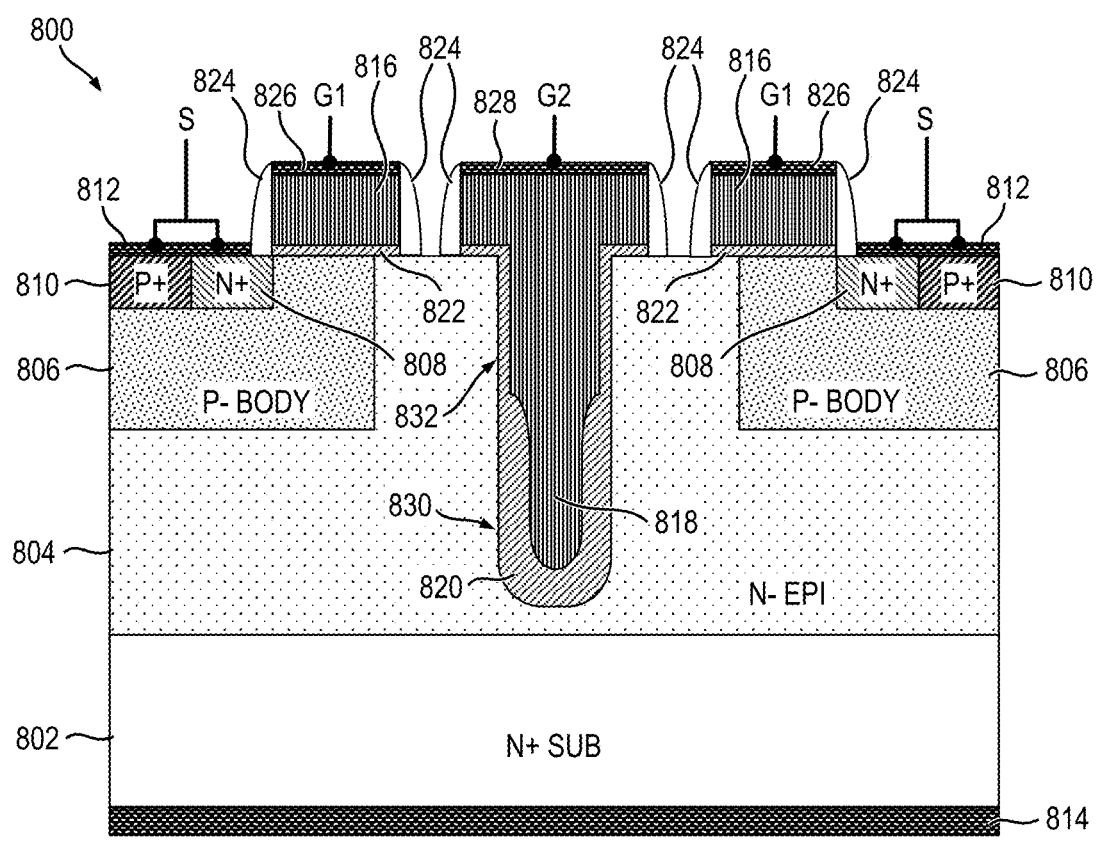
FIG. 8 is a cross-sectional view depicting at least a portion of an exemplary super gate MOSFET device having a gate structure with enhanced voltage blocking capability, according to an embodiment of the present invention.

FIG. 8 is a cross-sectional view depicting at least a portion of an exemplary super gate MOSFET device 800, according to an embodiment of the invention. The MOSFET device 800 is consistent with the illustrative super gate MOSFET device 400 shown in FIG. 4B, except that the gate structure is configured having enhanced voltage blocking capability. With reference to FIG. 8, the super gate MOSFET device 800 includes a substrate 802, which may be formed of single-crystalline silicon that is modified by adding an impurity or dopant (e.g., boron, phosphorous, arsenic, antimony, etc.) of a desired conductivity (n-type or p-type) and doping level. In this exemplary embodiment, the substrate 802 is doped to have n-type conductivity, and may thus be referred to as an n-substrate (N+ SUB). Other materials for forming the substrate 802 are similarly contemplated, such as, but not limited to, germanium, gallium arsenide, silicon carbide, gallium nitride, indium phosphide, etc.

An epitaxial region 804 is formed on an upper surface of the substrate 802. In this embodiment, the epitaxial region 804 is modified by adding an impurity or dopant of n-type conductivity (N− EPI), although a p-type epitaxial is similarly contemplated. The epitaxial region 804 in the MOSFET device 800 serves as a lightly-doped drift region in the device. Body regions 806, which in this embodiment are of p-type conductivity (P− BODY), are formed proximate an upper surface of the epitaxial region 804 and spaced laterally from one another. The body regions 806 in this exemplary embodiment may be formed by implanting a p-type impurity (e.g., boron) into a defined area of the epitaxial region 804 using standard CMOS fabrication techniques. The body regions 806 are preferably more heavily doped relative to the doping level of the substrate 802, such that the body regions have a lower resistivity than the substrate (e.g., about 0.01 to 0.3 Ω-cm).

Source regions 808 are formed in at least a portion of the respective body regions 806 proximate an upper surface of the body regions. The source regions 808 in the exemplary MOSFET device 800 are preferably doped having n-type conductivity. Heavily-doped regions 810 having a p-type conductivity, in this example, are formed proximate the upper surface of the body regions 806 and laterally adjacent to the respective source regions 808, to form body contacts of the MOSFET device 800. Respective source (S) electrodes 812 electrically connect each of the source regions 808 to a corresponding body contact 810.

The substrate 802 in the super gate MOSFET device 800 serves as a drain region.

Accordingly, a drain (D) electrode 814 is preferably formed on a back surface of the substrate/drain 802, such as during BEOL processing, and provides electrical connection with the substrate/drain. Like the MOSFET device 400 shown in FIG. 4B, the drain electrode 814, formed on the back-side surface of the MOSFET device 800, is on an opposite side of the wafer relative to the source electrodes 812, formed on the upper/front surface of the device; that is, the drain electrode 814 and source electrodes 812 are disposed on vertically opposing surfaces of the MOSFET device 800.

The MOSFET device 800 further includes a gate structure that comprises at least two portions: a planar gate (G1) 816 and a trench gate (G2) 818. In this illustrative embodiment, there are two planar gates 816 disposed on either side of the trench gate 818. The planar gates 816 and trench gate 818 are preferably formed as fingered (i.e., stripped) structures that are physically separated from one another, although the planar and trench gates are electrically connected at one or both ends of the fingers (not explicitly shown, but implied). In one or more alternative embodiments, the planar gates 816 and trench gate 818 may form a contiguous gate structure having planar and trench gate functionality.

In one or more embodiments, the trench gate 818, which may comprise polysilicon, is disposed vertically through the upper surface of the epitaxial region 804 between the body regions 806 and source regions 808, such that there is a source region 808 on both sides of the trench gate 818. The MOSFET device 800 includes a dielectric layer 820 which electrically isolates the trench gate 818 from the surrounding epitaxial layer 804, thereby preventing direct electrical contact between the trench gate 818 and the adjacent source regions 808 and body regions 806. In one or more embodiments, the dielectric layer 820 comprises an oxide, such as silicon dioxide, and may therefore be referred to as a trench gate oxide layer, although the invention is not limited to any specific electrically insulating materials.

In one or more embodiments, each of the planar gates 816 is disposed on the upper surface of the epitaxial region 804, overlapping at least a portion of a corresponding body region 806. A second dielectric layer 822 is formed between each of the planar gates 816 and the upper surface of the body regions 806 and epitaxial region 804 to electrically isolate the planar gates 816 from the body and epitaxial regions, and may therefore be referred to as planar gate oxide layers. Dielectric spacers 824 are preferably formed on sidewalls of the planar gates 816 and trench gate 818. The gate sidewall spacers 824 electrically isolate the planar gates from the trench gate, as well as electrically isolating the planar gates 816 from the respective source electrodes 812.

With continued reference to FIG. 8, the super gate MOSFET device 800 further includes first gate electrodes 826 in electrical connection with the planar gates 816, and a second gate electrode 828 in electrical connection with the trench gate 818. The gate electrodes 826 and 828 may be formed as silicide layers on at least a portion of an upper surface of the gates 816 and 818, respectively.

In order to improve the voltage blocking capability in the super gate MOSFET device 800, the trench gate structure is advantageously configured having a trench gate oxide layer 820 that is thicker at a lower portion 830 of the trench gate structure relative to an upper portion 832 of the trench gate structure. In one or more embodiments, the thickness of the trench gate oxide layer 820 at the upper portion 832 of the trench gate structure is about 10-50 nm and the thickness of the trench gate oxide layer at the lower portion 830 of the trench gate structure is about 50-500 nm, although embodiments of the invention are not limited to any particular dimensions. The planar gate oxide layer 822 under each of the planar gates (G1) 816 is preferably about 5-50 nm. One illustrative method of fabricating a super gate MOSFET device having a trench gate structure configured in this manner will be described in conjunction with FIGS. 9A through 9L.

Figure 9A:
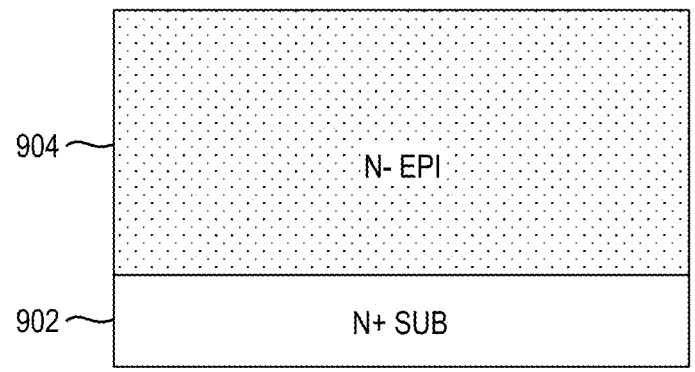
FIGS. 9A through 9L are cross-sectional views depicting at least a portion of exemplary processing steps in the fabrication of the exemplary super gate MOSFET device shown in FIG. 8, according to an embodiment of the present invention.

Specifically, FIGS. 9A through 9L are cross-sectional views depicting at least a portion of exemplary processing steps in the fabrication of the exemplary super gate MOSFET device 800 shown in FIG. 8, according to an embodiment of the invention. With reference to FIG. 9A, the illustrative fabrication process starts with a substrate 902, which in one or more embodiments comprises single-crystalline silicon or an alternative semiconductor material, such as, but not limited to, germanium, silicon germanium, silicon carbide, gallium arsenide, gallium nitride, or the like. In this illustrative embodiment, the substrate 902 is doped with an n-type impurity or dopant (e.g., phosphorus, etc.) to form an n-type conductivity substrate (N+ SUB), although embodiments are similarly contemplated in which a p-type conductivity substrate is employed. The substrate 902 preferably undergoes cleaning and surface treatment.

An epitaxial layer 904 is then formed on an upper surface of the substrate 902, such as by a standard epitaxial growth process. In one or more embodiments, the epitaxial layer is of n-type conductivity (N− EPI), although a p-type conductivity epitaxial layer is similarly contemplated. The doping concentration of the epitaxial layer 904 is preferably less compared to the doping concentration of the substrate 902.

Figure 9B:
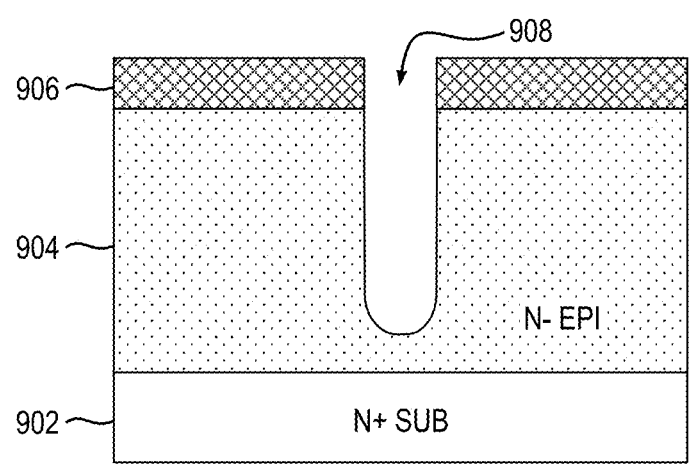
Figure 9C:
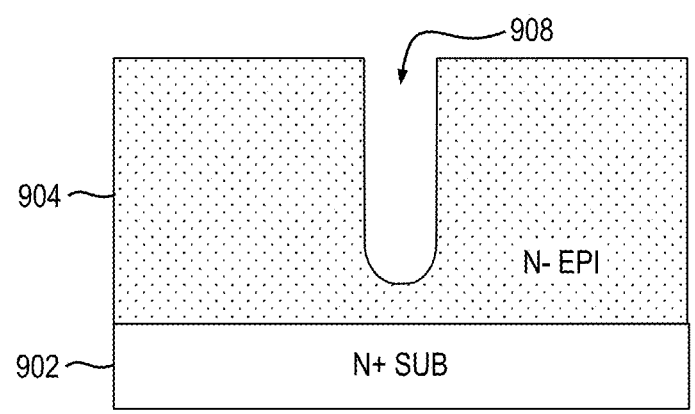

FIG. 9B shows the formation of a hard mask layer 906 on an upper surface of the epitaxial layer 904. In one or more embodiments, the hard mask layer 906, which may comprise silicon nitride, for example, is preferably formed using a standard deposition process. The hard mask layer 906 is then patterned, for example using standard photolithography and etching, and a trench 908 is formed at least partially through the epitaxial layer 904, such as by an etching process; in one or more embodiments, RIE is used to form the trench 908. The hard mask layer 906 is then removed, such as by etching, resulting in the structure shown in FIG. 9C.

Figure 9D:
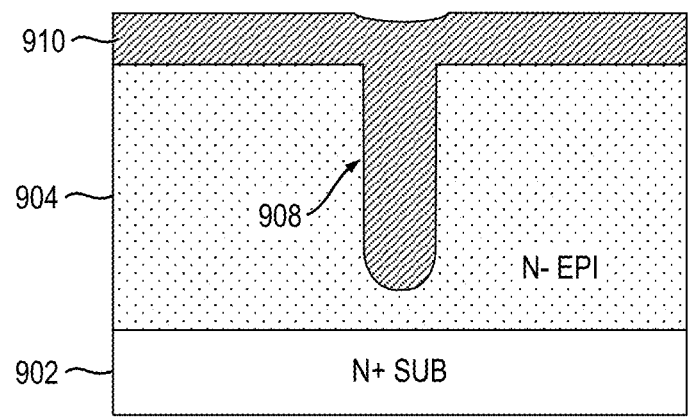
Figure 9E:
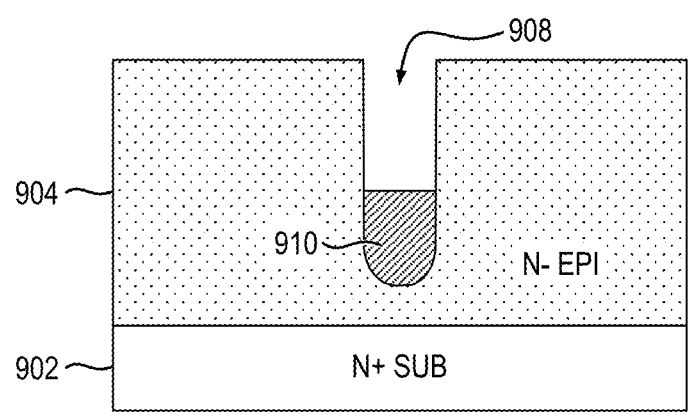
Figure 9F:
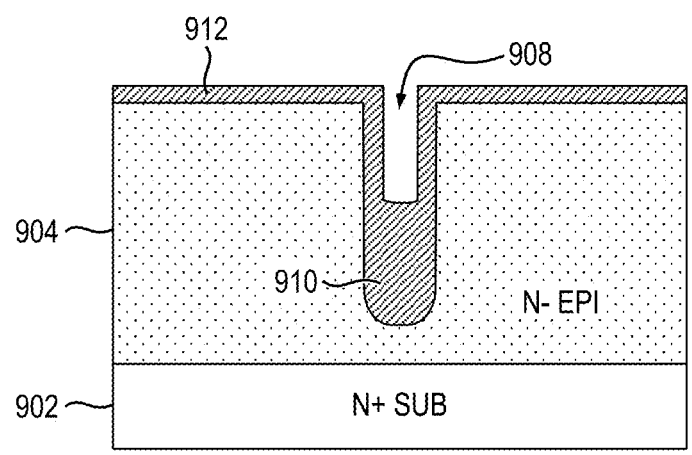

These first couple of steps in the fabrication of the super gate MOSFET device 800 are consistent with FIGS. 7A and 7B, depicting an exemplary fabrication process for forming the exemplary super gate MOSFET device 400 shown in FIG. 4B. With reference now to FIG. 9D, an insulating layer 910 is formed in the trench 908 and on at least a portion of the upper surface of the epitaxial layer 904. In one or more embodiments, the insulating layer 910 comprises an oxide (e.g., silicon dioxide) which is grown or deposited in the trench 908 and on the upper surface of the epitaxial layer 904. An etch-back process is then performed, such as, for example, a wet etch, to remove the insulating layer 910 on the upper surface of the epitaxial layer 904 and partially on sidewalls of the trench 908, allowing some of the insulating layer 910 to remain in the bottom portion of the trench, as shown in FIG. 9E. In FIG. 9F, the wafer is subjected to a thermal oxidation process to thereby form a thin conformal gate oxide layer 912. In one or more embodiments, a thickness of the oxide layer 912 on the upper surface of the epitaxial layer 904 and sidewalls of the trench 908 is about 30-50 nm, although embodiments of the invention are not limited to any specific dimensions.

Figure 9G:
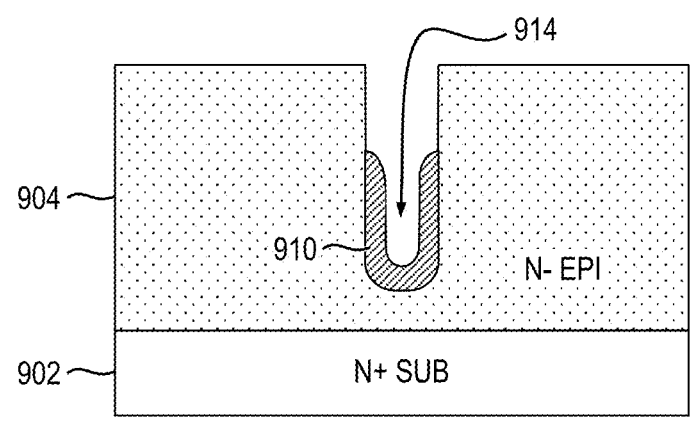
Figure 9H:
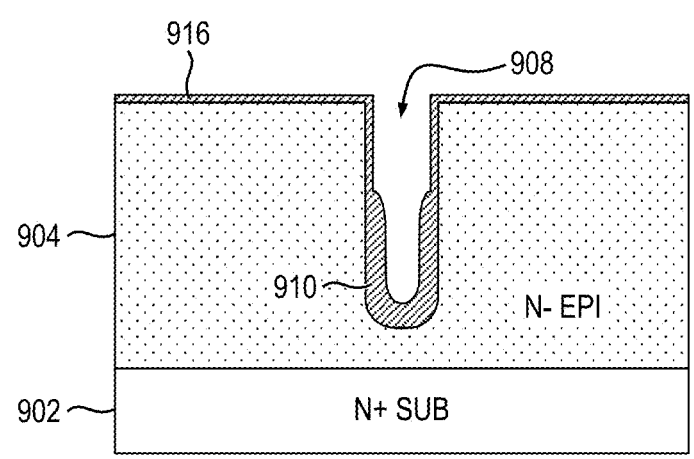
Figure 9I:
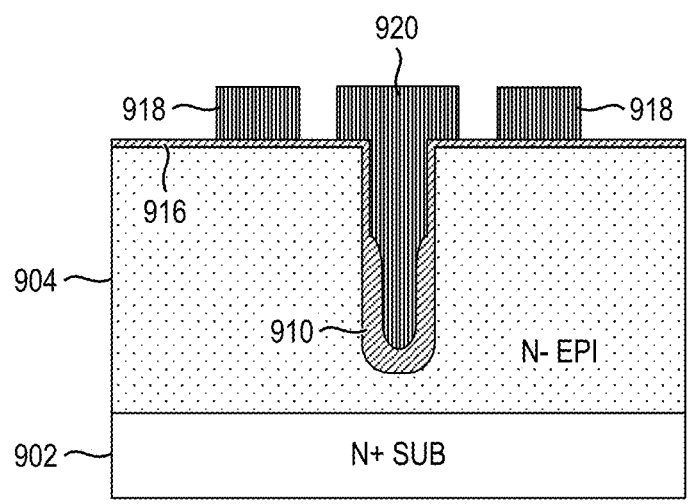

In one or more embodiments, anisotropic etching (e.g., RIE) is used to form a narrower trench 914 within the insulating layer 910, as depicted in FIG. 9G. A thin gate oxide layer 916 (e.g., about 30-50 nm) is then grown on an upper portion of the sidewalls of the first trench 908 and on the upper surface of the epitaxial layer 904, as depicted in FIG. 9H. Next, a gate structure is formed including planar gates 918 and a trench gate 920, as shown in FIG. 9I. Each of the planar and trench gates 918, 920 preferably comprises polysilicon and is formed using a standard deposition process, followed by patterning (e.g., using standard photolithography and etching) and etching. In this illustrative embodiment, there are two planar gates 918 disposed on either side of the trench gate 920. Although not explicitly shown in FIG. 9I, the planar gates 918 and trench gate 920 are preferably formed as fingered (i.e., stripped) structures that are physically separated from one another, with the planar and trench gates being electrically connected at one or both (opposing) ends of the fingers.

Figure 9J:
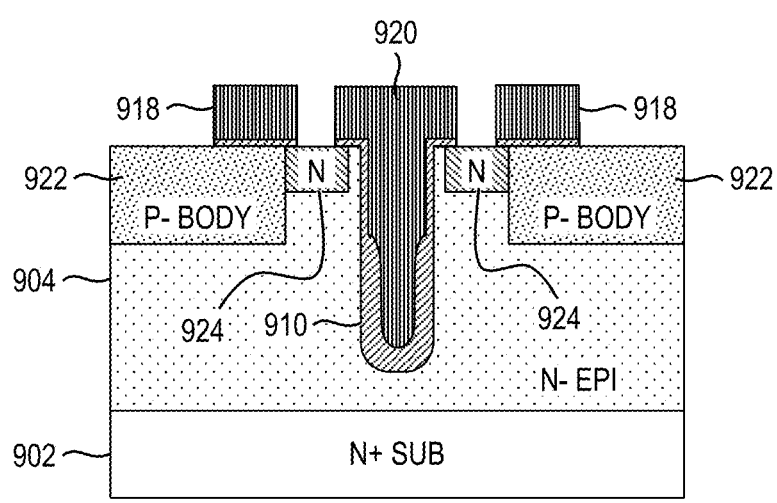

With reference now to FIG. 9J, exposed portions of the gate oxide layer (916 in FIG. 9I) on the upper surface of the epitaxial layer 904 (i.e., portions of the gate oxide layer not covered by and extending beyond the planar gates 918 and trench gate 920) are removed, such as by using a selective etching process. Self-aligned body regions 922 are then formed in the epitaxial layer 904 proximate the upper surface of the epitaxial layer. In this exemplary embodiment, the body regions 922 are preferably formed by implanting a p-type dopant of a prescribed concentration level into the epitaxial layer 904, followed by heat treatment (e.g., annealing) to drive the dopant into the epitaxial layer.

Optionally, in the embodiment shown in FIG. 9J, implant regions 924 are preferably formed in the epitaxial layer 904, proximate the upper surface of the epitaxial layer and between the body regions 922 and trench gate 920. In one or more embodiments, the implant regions 924 are formed by implanting an n-type dopant of a prescribed concentration level into the epitaxial layer 904, between the planar gates 918 and trench gate 920. During implantation, the planar and trench gates are used as a mask. In a manner consistent with the description of the implant regions 718 shown in FIG. 7F, the implant regions 924 preferably serve to increase the n-type doping concentration level at the edge of the channel formed in the body regions 922, thereby reducing the on-resistance of the MOSFET device. The implant regions 924 also serve to limit the channel region under the planar gates 918 for improved high-frequency performance. Each of the implant regions 924 has a preferred doping concentration of about $1\times10^{16}$ to $1\times10^{18}$ atoms/cm$^3$, although embodiments of the invention are not limited to any specific doping concentration.

Figure 9K:
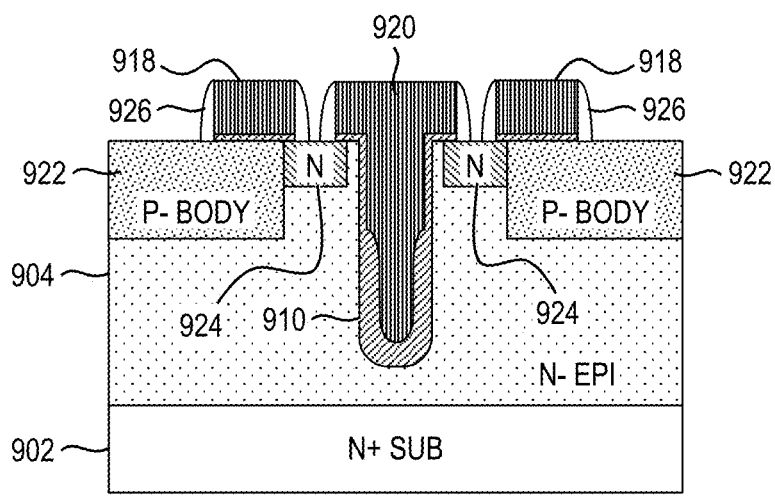

Dielectric spacers 926 are then formed on sidewalls of the planar gates 918 and trench gate 920, as shown in FIG. 9K. The dielectric spacers 926 may comprise silicon dioxide in one or more embodiments, although the invention is not limited to any specific dielectric material. An etching process is performed to create a desired pattern for source region contacts (e.g., n-type) and body pick-up contacts (e.g., p-type) subsequently formed in the device.

Figure 9L:
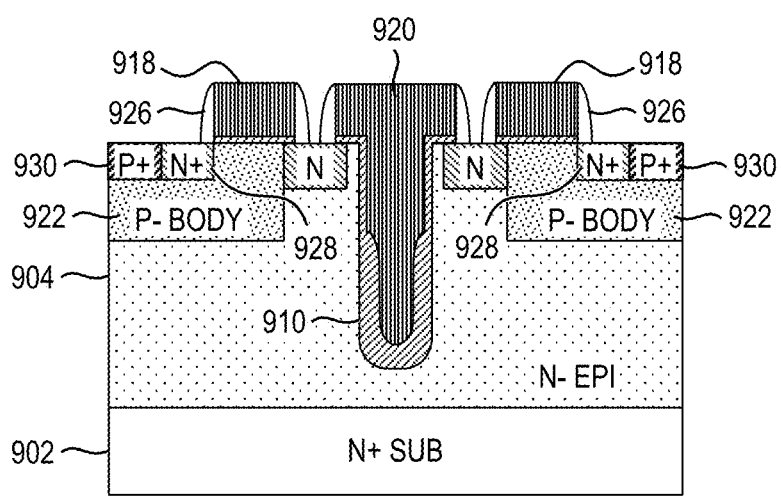

In FIG. 9L, source regions 928 are formed in the respective body regions 922, proximate an upper surface of the body regions and self-aligned with the planar gates 918. In this exemplary embodiment, the source regions 928 are of n-type conductivity formed, for example, using a standard implant process (e.g., ion implantation). Heavily-doped regions 930 having a p-type conductivity, in this example, are formed proximate the upper surface of the body regions 922, laterally adjacent to the respective source regions 928, to form body contacts of the super gate MOSFET device. Each of the source regions 928 is therefore electrically connected to a respective body contact 930.

A standard front-side silicidation process is used to form metal silicide contacts (812) at the source regions 928 and metal silicide contacts (826 and 828) at the planar gates 918 and trench gate 920. Front-side interconnect and passivation is then performed with metal (e.g., aluminum, etc.) and dielectric deposition and patterning during FEOL processing. After FEOL processing has been completed, the wafer is flipped for back-side thinning (e.g., using CMP) and back-side metallization to form a drain contact (814), thus yielding the super gate MOSFET device 800 shown in FIG. 8.

Figure 10:
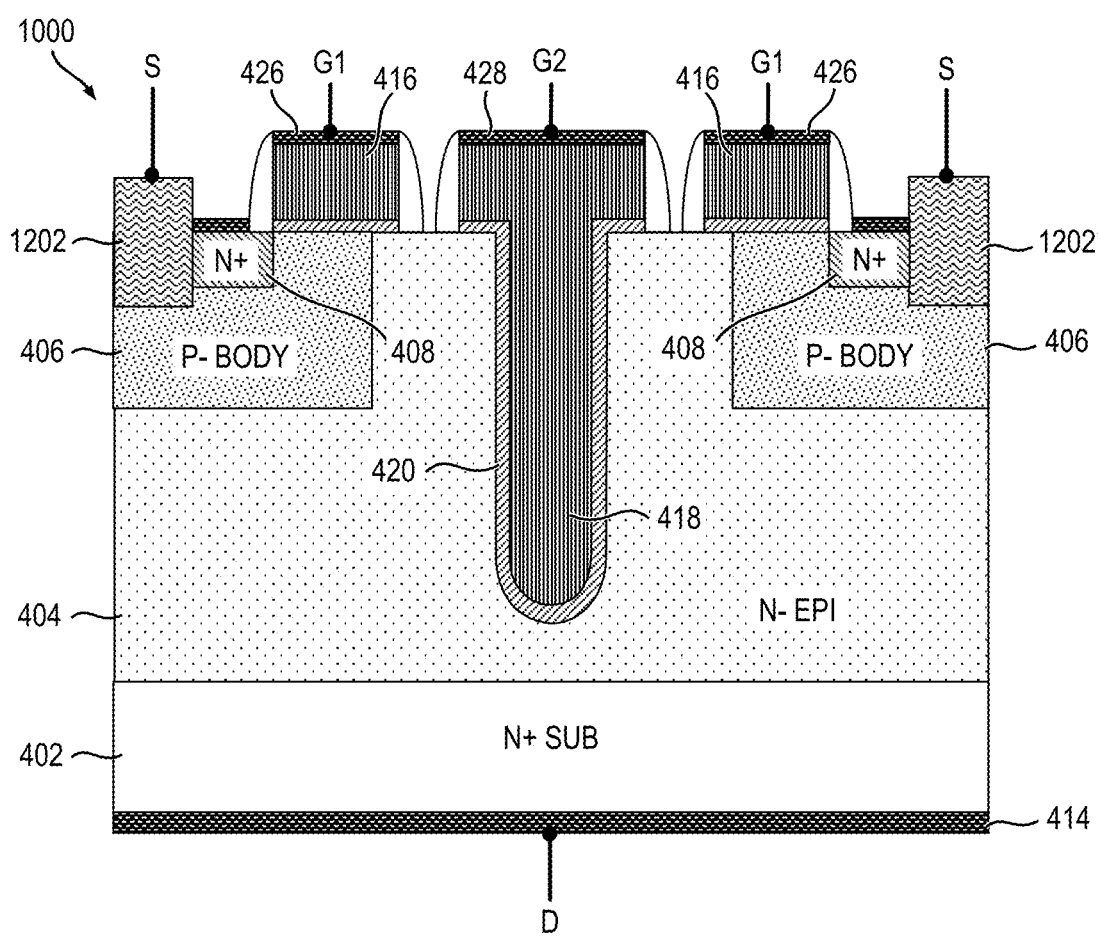
FIG. 10 is a cross-sectional view depicting at least a portion of an exemplary super gate MOSFET device having an enhanced source contact, according to an embodiment of the present invention.

FIG. 10 is a cross-sectional view depicting at least a portion of an exemplary super gate MOSFET device 1000 having an enhanced source contact, according to another embodiment of the invention. The MOSFET device 1000 is consistent with the illustrative super gate MOSFET device 400 shown in FIG. 4B, except for the formation of the source contact. Specifically, with reference to FIG. 10, the super gate MOSFET device 1000 includes recessed source contacts 1202 formed in the respective body regions 406, proximate an upper surface of the body regions and electrically connected with and adjacent to the source regions 408. In one or more embodiments, each of the recessed source contacts 1202 comprises a metal, such as, for example, tungsten, although embodiments of the invention are not limited to tungsten. This source contact structure provides a larger contact area between the source metal and the source region 408, and therefore beneficially achieves reduced source contact resistance. It is to be appreciated that this source contact structure can be employed in conjunction with any of the super gate MOSFET device structures described herein, as will become apparent to those skilled in the art given the teachings herein. Although not explicitly shown in FIG. 10, metal silicide can also be formed around the recessed source contacts 1202 using a metal silicidation process consistent with the formation of the planar and trench gate contacts 426 and 428, respectively, as will become apparent to those skilled in the art given the teachings herein.

Figure 11:
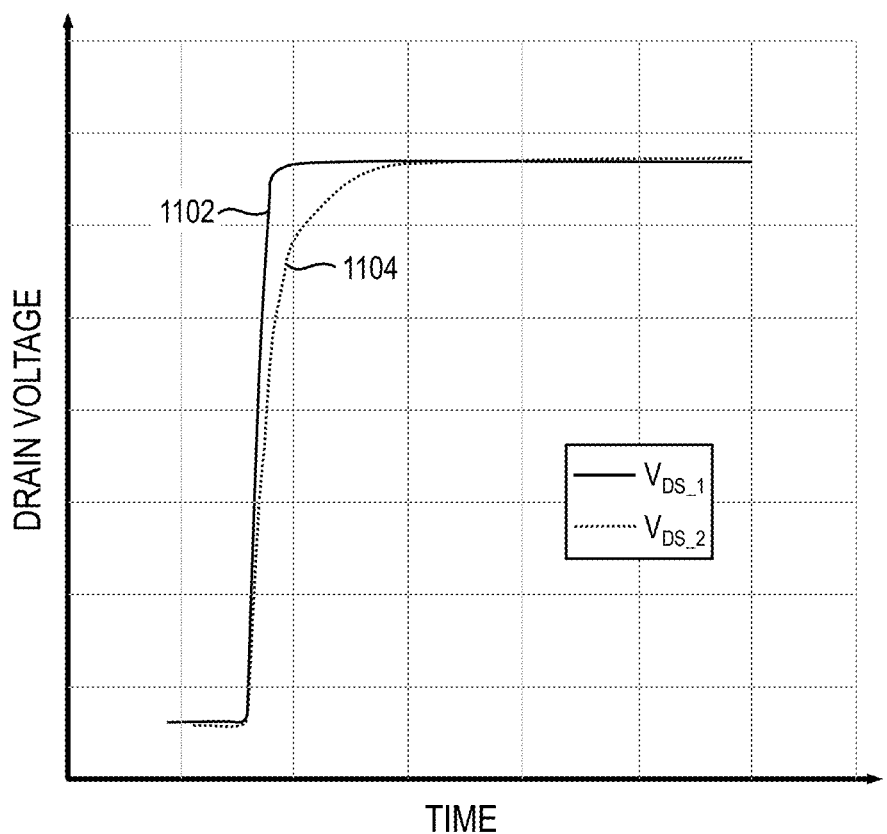
FIG. 11 is a graph conceptually depicting exemplary plots of drain voltage as a function of time for a super gate MOSFET device, formed in accordance with one or more embodiments of the present invention, compared with a standard MOSFET device.

A MOSFET device according to embodiments of the invention achieves superior performance compared to standard MOSFET device designs. For example, FIG. 11 is a graph conceptually depicting exemplary plots of drain voltage as a function of time for a super gate MOSFET device (plot 1102), such as the illustrative super gate MOSFET device 400 shown in FIG. 4B, compared with a standard MOSFET device (plot 1104). As apparent from FIG. 11, a rising edge of the drain voltage as a function of time (i.e., dv/dt) for the novel super gate MOSFET device is significantly faster relative to a standard MOSFET device. This evidences an advantageous increase in switching speed for the novel super gate MOSFET device.

Figure 12:
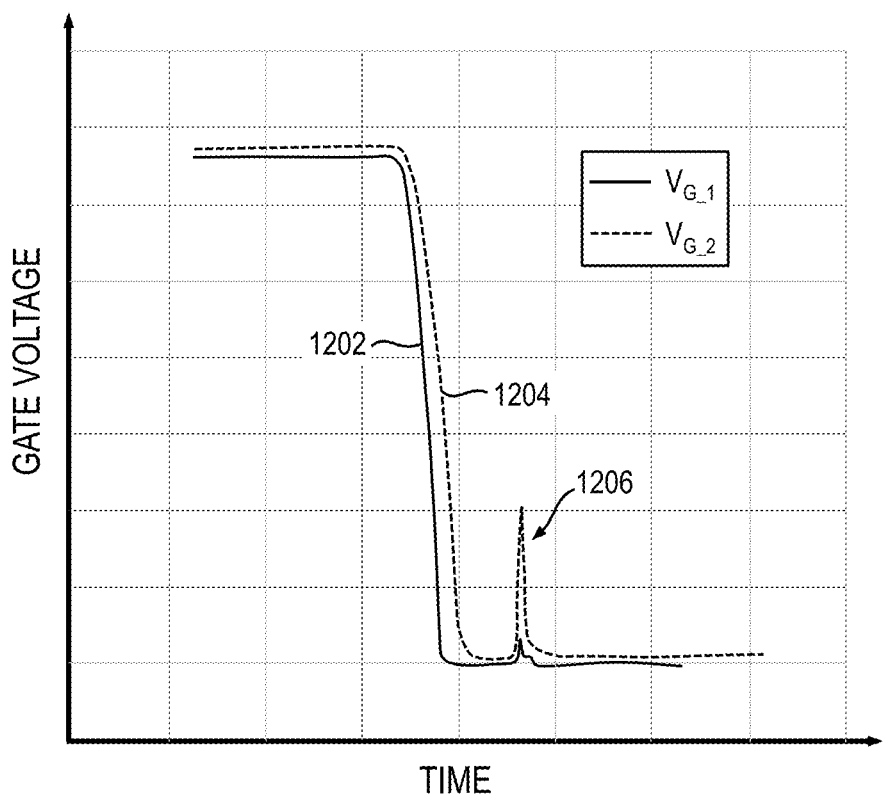
FIG. 12 is a graph conceptually depicting exemplary plots of gate voltage as a function of time for a super gate MOSFET device, formed in accordance with one or more embodiments of the present invention, compared with a standard MOSFET device.

FIG. 12 is a graph conceptually depicting exemplary plots of gate voltage as a function of time for a super gate MOSFET device (plot 1202), such as the illustrative super gate MOSFET device 400 shown in FIG. 4B, compared with a standard MOSFET device (plot 1204). As apparent from FIG. 12, the standard MOSFET device exhibits a severe disturbance 1206 in gate voltage as the device is switched off. This disturbance, which is caused primarily by drain voltage coupling effects through the larger parasitic Miller capacitance ($C_{gd}$) associated with the standard MOSFET device (as previously explained), can exceed the device threshold voltage, thereby causing the device to falsely turn on. This false device turn-on can undesirably lead to a short circuit condition, especially when the MOSFET device is used as a low-side transistor in a power switching application (e.g., DC-DC converter). By comparison, the super gate MOSFET device represented by plot 1202 exhibits very minimal gate voltage disturbance, well below the threshold voltage of the device, thereby beneficially eliminating the device false turn-on problem. As a result, the super gate MOSFET device according to embodiments of the invention is able to achieve higher frequency DC-DC converter operation with higher efficiency and enhanced reliability compared to conventional MOSFET devices.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having power MOSFET devices therein formed in accordance with one or more embodiments of the invention, such as, for example, radio frequency (RF) power amplifiers, power management IC, etc.

An integrated circuit in accordance with aspects of the present disclosure can be employed in essentially any high-frequency, high-power application and/or electronic system, such as, but not limited to, RF power amplifiers, power management ICs, etc. Suitable systems for implementing embodiments of the invention may include, but are not limited to, DC-DC converters. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above," "below," "upper" and "lower" are used to indicate a position of elements or structures relative to one another, rather than absolute positioning.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A metal-oxide semiconductor field-effect transistor (MOSFET) device, comprising:
   a semiconductor substrate of a first conductivity type;
   an epitaxial region of the first conductivity type disposed on an upper surface of the substrate;
   at least two body regions of a second conductivity type formed in the epitaxial region, the second conductivity type being opposite in polarity to the first conductivity type, the body regions being disposed proximate an upper surface of the epitaxial region and spaced laterally from one another;
   at least two source regions of the first conductivity type, each of the source regions being disposed in a corresponding one of the body regions proximate an upper surface of the body region;
   a gate structure comprising: at least two planar gates, each of the planar gates being disposed on the upper surface of the epitaxial region and overlapping at least a portion of a corresponding body region; and a trench gate formed at least partially through the epitaxial region and between the body regions; and
   a drain contact disposed on a back surface of the substrate and electrically connected with the substrate.

2. The device of claim 1, wherein the at least two planar gates and the trench gate are formed as a T-shaped contiguous gate having planar gate and trench gate functionality.

3. The device of claim 1, further comprising:
   a first dielectric layer disposed between each of the at least two planar gates and underlying portions of the corresponding body region and epitaxial region; and
   a second dielectric layer disposed between the trench gate and the adjacent epitaxial region.

4. The device of claim 3, wherein the second dielectric layer is formed having a non-uniform thickness, a first portion of the second dielectric layer, defining a bottom wall of the trench gate and extending partially up sidewalls of the trench gate, having a first thickness associated therewith, and a second portion of the second dielectric layer, extending up the sidewalls of the trench gate and onto the upper surface of the epitaxial layer, having a second thickness associated therewith, the first thickness being greater than the second thickness.

5. The device of claim 1, wherein the at least two planar gates and the trench gate are formed as fingered structures that are physically separated from one another, the fingered structures being electrically connected together at one or both ends of the fingered structures.

6. The device of claim 1, further comprising dielectric spacers formed on sidewalls of the at least two planar gates of the gate structure and on sidewalls of a portion of the trench gate extending on the upper surface of the epitaxial layer.

7. The device of claim 1, further comprising at least two doped regions having the second conductivity type formed proximate the upper surface of the body regions and laterally adjacent to the respective source regions, to form body contacts of the device.

8. The device of claim 1, further comprising a plurality of implant regions having the first conductivity type, each of the implant regions being disposed proximate the upper surface of the epitaxial layer and between a corresponding one of the body regions and the trench gate.

9. The device of claim 8, wherein vertical edges of each of the implant regions are self-aligned with the planar gates and the trench gate of the gate structure.

10. The device of claim 8, wherein a doping concentration of each of the implant regions is about $1 \times 10^{16}$ atoms/cm$^3$ to about $1 \times 10^{18}$ atoms/cm$^3$.

11. The device of claim 1, further comprising a plurality of gate electrodes electrically connected with the respective planar gates and trench gate of the gate structure, each of the gate electrodes comprising a metal silicide layer formed on at least a portion of an upper surface of a corresponding one of the planar gates and trench gate.

12. The device of claim 1, further comprising at least two recessed source contacts, each of the source contacts being formed in a corresponding one of the body regions, proximate an upper surface of the body region and electrically connected with and adjacent to a corresponding one of the source regions.

13. The device of claim 1, wherein a doping concentration of each of the body regions is about $5 \times 10^{16}$ atoms/cm$^3$ to about $1 \times 10^{18}$ atoms/cm$^3$.

14. The device of claim 1, wherein the gate structure is configured such that when biased positively above a threshold voltage of an n-channel MOSFET device, a channel is formed in each of the body regions underneath the planar gates, thereby turning on the device, and concurrently a strong accumulation layer of majority carriers is formed in the epitaxial region proximate a surface of the trench gate.

15. The device of claim 14, wherein the gate structure is configured such that a concentration of the majority carriers in the device is modulated as a function of a bias voltage applied to the trench gate.

16. A method of fabricating a metal-oxide semiconductor field-effect transistor (MOSFET) device, the method comprising:
  forming an epitaxial region of a first conductivity type on an upper surface of a substrate of the first conductivity type;
  forming at least two body regions of a second conductivity type in the epitaxial region, the second conductivity type being opposite in polarity to the first conductivity type, the body regions being disposed proximate an upper surface of the epitaxial region and spaced laterally from one another;
  forming at least two source regions of the first conductivity type, each of the source regions being disposed in a corresponding one of the body regions proximate an upper surface of the body region;
  forming a gate structure comprising at least two planar gates and a trench gate, each of the planar gates being disposed on the upper surface of the epitaxial region and overlapping at least a portion of a corresponding body region, the trench gate being formed at least partially through the epitaxial region between the body regions; and
  forming a drain contact on a back surface of the substrate and electrically connected with the substrate.

17. The method of claim 16, further comprising forming the at least two planar gates and the trench gate as a T-shaped contiguous gate having planar gate and trench gate functionality.

18. The method of claim 16, further comprising:
  forming a first dielectric layer between each of the at least two planar gates and underlying portions of the corresponding body region and epitaxial region; and
  forming a second dielectric layer between the trench gate and the adjacent epitaxial region.

19. The method of claim 18, further comprising forming the second dielectric layer having a non-uniform thickness, a first portion of the second dielectric layer, defining a bottom wall of the trench gate and extending partially up sidewalls of the trench gate, having a first thickness associated therewith, and a second portion of the second dielectric layer, extending up the sidewalls of the trench gate and onto the upper surface of the epitaxial layer, having a second thickness associated therewith, the first thickness being greater than the second thickness.

20. The method of claim 16, further comprising:
  forming the at least two planar gates and the trench gate as fingered structures that are physically separated from one another; and
  electrically connecting the fingered structures together at one or both ends of the fingered structures.

21. The method of claim 16, further comprising forming dielectric spacers on sidewalls of the at least two planar gates of the gate structure and on sidewalls of a portion of the trench gate extending on the upper surface of the epitaxial layer.

22. The method of claim 16, further comprising modulating a concentration of majority carriers in the device as a function of a bias voltage applied to the trench gate.

23. The method of claim 16, further comprising configuring the gate structure such that when biased positively above a threshold voltage of an n-channel MOSFET device, a channel is formed in each of the body regions underneath the planar gates, thereby turning on the device, and concurrently a strong accumulation layer of majority carriers is formed in the epitaxial region proximate a surface of the trench gate.

* * * * *